United States Patent
Sung et al.

(10) Patent No.: US 11,405,052 B2
(45) Date of Patent: Aug. 2, 2022

(54) COMPRESSION OF HIGH DYNAMIC RATIO FIELDS FOR MACHINE LEARNING

(71) Applicant: QUALCOMM Incorporated, San Diego, CA (US)

(72) Inventors: Clara Ka Wah Sung, Markham (CA); Meghal Varia, North York (CA); Serag Gadelrab, Markham (CA); Cheng-Teh Hsieh, Del Mar, CA (US); Jason Edward Podaima, Richmond Hill (CA); Victor Szeto, Richmond Hill (CA); Richard Boisjoly, Markham (CA); Milivoje Aleksic, Del Mar, CA (US); Tom Longo, Markham (CA); In-Suk Chong, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 17/333,282

(22) Filed: May 28, 2021

(65) Prior Publication Data

US 2021/0288660 A1    Sep. 16, 2021

Related U.S. Application Data

(63) Continuation of application No. 16/798,186, filed on Feb. 21, 2020, now Pat. No. 11,025,271.

(60) Provisional application No. 62/809,262, filed on Feb. 22, 2019.

(51) Int. Cl.
*H03M 7/00* (2006.01)
*H03M 7/30* (2006.01)
*G06F 17/18* (2006.01)
*G06N 20/00* (2019.01)
*G06N 5/04* (2006.01)
*G06F 13/28* (2006.01)

(52) U.S. Cl.
CPC .......... *H03M 7/3066* (2013.01); *G06F 17/18* (2013.01); *G06N 5/04* (2013.01); *G06N 20/00* (2019.01); *H03M 7/3059* (2013.01); *H03M 7/6005* (2013.01); *G06F 13/28* (2013.01); *H03M 7/00* (2013.01)

(58) Field of Classification Search
CPC ............ H03M 7/3066; H03M 7/3059; H03M 7/6005; G06N 20/00; G06N 5/04; G06F 17/18

See application file for complete search history.

(56) References Cited

U.S. PATENT DOCUMENTS

| | | | |
|---|---|---|---|
| 9,946,462 B1 * | 4/2018 | Li | G06F 12/0246 |
| 11,025,271 B2 | 6/2021 | Sung | |
| 2019/0197420 A1 | 6/2019 | Singh et al. | |

* cited by examiner

*Primary Examiner* — Joseph J Lauture
(74) *Attorney, Agent, or Firm* — The Marbury Law Group

(57) ABSTRACT

Various embodiments include methods and devices for implementing decompression of compressed high dynamic ratio fields. Various embodiments may include receiving compressed first and second sets of data fields, decompressing the first and second compressed sets of data fields to generate first and second decompressed sets of data fields, receiving a mapping for mapping the first and second decompressed sets of data fields to a set of data units, aggregating the first and second decompressed sets of data fields using the mapping to generate a compression block comprising the set of data units.

18 Claims, 14 Drawing Sheets

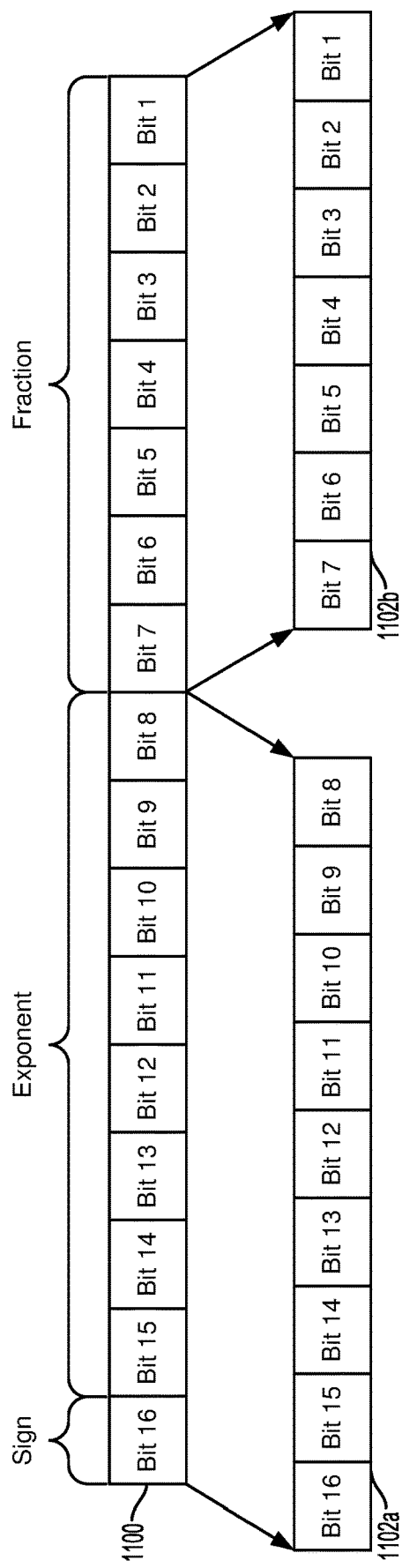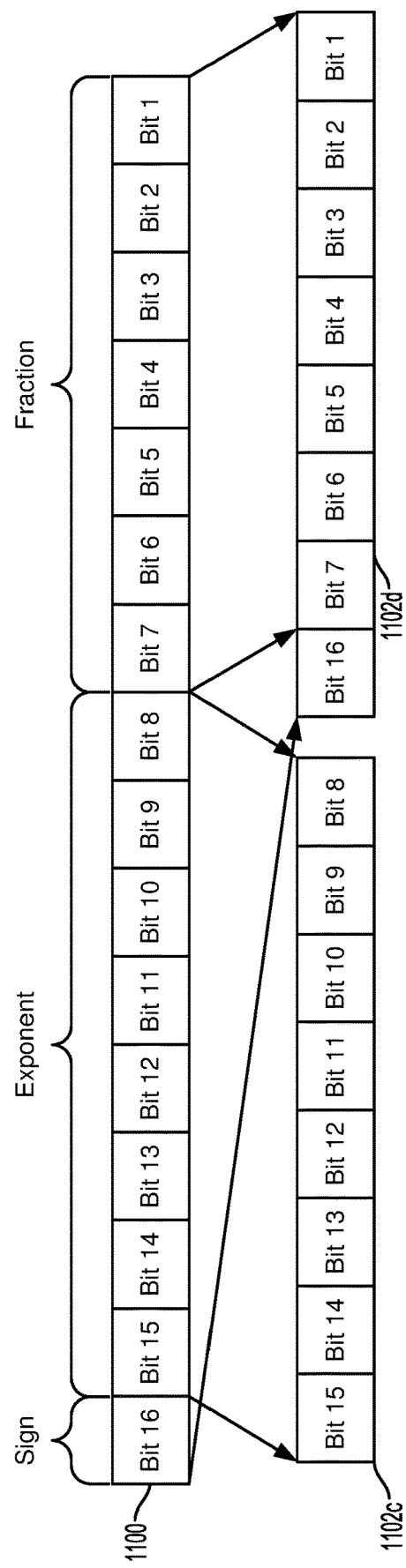
FIG. 11A
FIG. 11B

COMPRESSION OF HIGH DYNAMIC RATIO FIELDS FOR MACHINE LEARNING

PRIORITY APPLICATIONS

This application is a continuation of U.S. patent application Ser. No. 16/798,186 entitled "Compression Of High Dynamic Ratio Fields For Machine Learning" filed Feb. 21, 2020, and claims the benefit of priority to U.S. Provisional Patent Application Ser. No. 62/809,262 entitled "Compression Of High Dynamic Ratio Fields For Machine Learning" filed on Feb. 22, 2019. The entire contents of these documents are incorporated herein by reference for all purposes.

BACKGROUND

Existing compression hardware and/or software may be configured to handle data compression for data matching the specifications of the compression hardware and/or software. Such specifications may make the compression hardware and/or software inflexible and incapable of handling compression of data outside of the specifications.

SUMMARY

Various aspects include methods and computing devices configured to implement the methods for compressing high dynamic ratio fields of data. Various aspects include receiving a compression block having data units, receiving a mapping for the compression block, in which the mapping is configured to map bits of each data unit to two or more data fields to generate a first set of data fields and a second set of data fields, compressing the first set of data fields together to generate a compressed first set of data fields, and compressing the second set of data fields together to generate a compressed second set of data fields. In some aspects, the mapping may map the bits of each data unit to the two or more data fields based on any of sizes of the data units, types of the data units, locality of portions of the data units, or estimated compression ratios of portions of the data units. In some aspects, the data units each may have a size of M bits that is greater than a quantum for compression of size N bits, and the data fields each have a size no greater than N bits. Some aspects may further include separating the bits of each data unit into the two or more data fields according to the mapping. In some aspects, compressing the first set of data fields together to generate a compressed first set of data fields may include compressing the first set of data fields using a first compression method, and compressing the second set of data fields together to generate a compressed second set of data fields may include compressing the second set of data fields using a second compression method, in which the first compression method may be different from the second compression method.

Some aspects may further include analyzing a plurality of mappings for the compression block for bits of the data units mapped to data fields having a locality exceeding a locality threshold, estimating a compression ratio for mappings having locality exceeding the locality threshold, and selecting the mapping having the highest estimated compression ratio.

Some aspects may further include dynamically generating a mapping for the compression block. In such aspects, dynamically generating a mapping for the compression block may include executing a machine learning algorithm with data of a reconstructed compression block, updating a mapping machine learning algorithm with compression statistics resulting from the execution of the machine learning algorithm with the data of the reconstructed compression block, and executing the mapping machine learning algorithm to generate mapping parameters for compressing the compression block. In such aspects, dynamically generating a mapping for the compression block may include executing a machine learning algorithm with data of a reconstructed compression block, associating compression statistics resulting from the execution of the machine learning algorithm with a compression ratio of the compression block, and executing a directed search engine to generate mapping parameters for compressing the compression block.

Further aspects include a computing device having a processor and other components configured to perform operations of any of the methods summarized above. Further aspects include a computing device having means for performing functions of any of the methods summarized above. Further aspects include a non-transitory processor-readable medium having stored thereon processor-executable instructions configured to cause a processor and other components of a computing device to perform operations of any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIGS. 11A and 11B are block diagrams illustrating example mappings of 16-bit floating point data in the bfloat 16 floating point format to data fields according to some embodiments.

DETAILED DESCRIPTION

Figure 1:
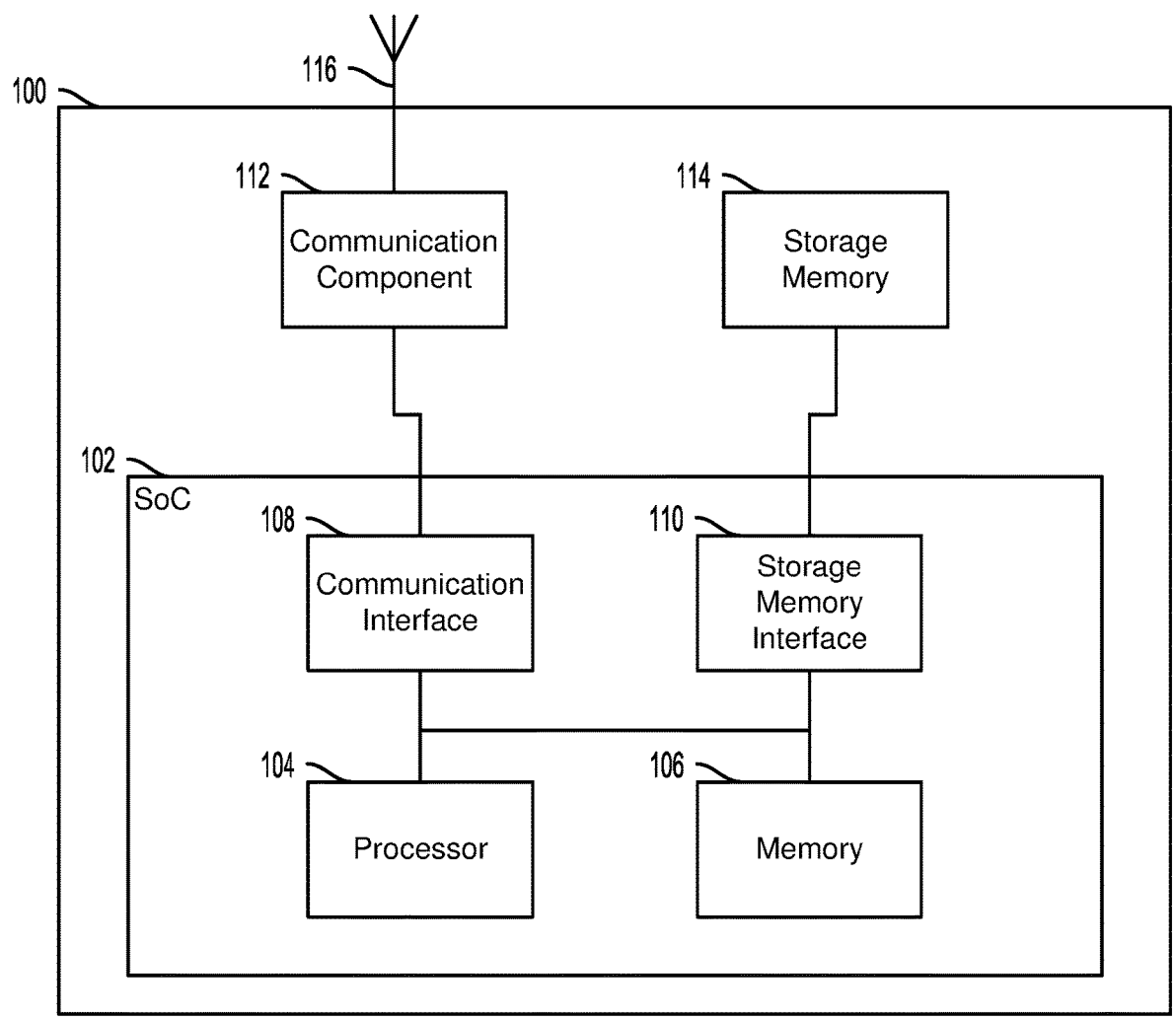
FIG. 1 is a component block diagram illustrating an example computing device suitable for implementing various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include methods, and computing devices implementing such methods, for memory compression of high dynamic ratio fields of data, which may be of particular usefulness in storing data associated with machine learning. In some embodiments, M bit data units of a compression block of size K bytes may each be separated into S data fields each. In some embodiments, the S data fields may be sized based on a configuration of existing compression hardware and/or software to compress an N number of bits. In some embodiments, portions of the data units may be mapped to the data fields based on various parameters, including, for example, mapping portions of the data units based on a likelihood that a value of a portion of a first data unit is the same, somewhat similar, or different from a value of the portion of a second data unit. In some embodiments, the data fields may be sized based on various parameters, including, for example, mapping portions of the data units based on a likelihood that values of various portions of a first data unit are the same, somewhat similar, or different from values of the portions of a second data unit. In some embodiments, mappings of data units to data fields may be preconfigured and selected based on various parameters. In some embodiments, mappings of data units to data fields may be learned via a machine learning algorithm and/or a directed search engine.

In some embodiments, data fields corresponding to each of the data units may be grouped together and compressed by a compression engine. In some embodiments, the compression engine may generate metadata indicating how the data fields are compressed, and a decompression engine may use the metadata to decompress the data fields. In some embodiments, the compression engine may group multiple compressed data fields into a memory transaction (referred to herein as a compressed data transaction) configured to store the compressed data fields to a memory. In some embodiments, the compression block and the data units may include activation data and/or weight data for and/or generated by machine learning algorithms.

The terms "computing device" is used herein to refer to any one or all of Internet of Things (IoT) devices, smart appliances, cellular telephones, smartphones, personal or mobile multi-media players, laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory and a programmable processor. The term "computing device" may further refer to stationary computing devices including personal computers, desktop computers, all-in-one computers, workstations, super computers, mainframe computers, embedded computers, servers, home theater computers, Compression of activation and weight data of machine learning networks during inference and training may save memory, such as random access memory (RAM), and memory-access bandwidth, both of which may improve performance and save energy/power. Data compression hardware is often designed for a quantum (i.e., a designated size) of N bits, such as a quantum of 8 bits, influenced by a traditional pixel of 8 bits, simple hardware to implementation for 8-bit compression, and many known ways of compressing 8 bits of data. However, compression hardware designed for a quantum of N bits may not be efficient for compression of data fields that are larger than the quantum of N bits, such as 16-bit floating point data (several variations), 16-bit fixed point data, and 32-bit floating point data. Various embodiments described herein may support compression of fields of data that are larger than the quantum of N bits using compression hardware designed for the quantum of N bits. Further, various embodiments described herein may achieve compression of fields of data that are larger than the quantum of N bits using compression hardware designed for the quantum of N bits while maintaining an acceptable compression ratio of data fields that are larger than the quantum of N bits.

FIG. 1 illustrates a system including a computing device 100 suitable for use with various embodiments. The computing device 100 may include a system-on-chip (SoC) 102 with a processor 104, a memory 106, a communication interface 108, and a storage memory interface 110. The computing device 100 may further include a communication component 112, such as a wired or wireless modem, a storage memory 114, and an antenna 116 for establishing a wireless communication link. The processor 104 may include any of a variety of processing devices, for example a number of processor cores.

The term "system-on-chip" (SoC) is used herein to refer to a set of interconnected electronic circuits typically, but not exclusively, including a processing device, a memory, and a communication interface. A processing device may include a variety of different types of processors 104 and processor cores, such as a general purpose processor, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, and a multicore processor. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

An SoC 102 may include one or more processors 104. The computing device 100 may include more than one SoC 102, thereby increasing the number of processors 104 and processor cores. The computing device 100 may also include processors 104 that are not associated with an SoC 102. Individual processors 104 may be multicore processors. The processors 104 may each be configured for specific purposes that may be the same as or different from other processors 104 of the computing device 100. One or more of the processors 104 and processor cores of the same or different configurations may be grouped together. A group of processors 104 or processor cores may be referred to as a multiprocessor cluster.

The memory 106 of the SoC 102 may be a volatile or non-volatile memory configured for storing data and processor-executable code for access by the processor 104. The computing device 100 and/or SoC 102 may include one or more memories 106 configured for various purposes. One or more memories 106 may include volatile memories such as random access memory (RAM) or main memory, or cache memory. These memories 106 may be configured to temporarily hold a limited amount of data received from a data sensor or subsystem, data and/or processor-executable code instructions that are requested from non-volatile memory, loaded to the memories 106 from non-volatile memory in anticipation of future access based on a variety of factors, and/or intermediary processing data and/or processor-executable code instructions produced by the processor 104 and temporarily stored for future quick access without being stored in non-volatile memory.

The memory 106 may be configured to store data and processor-executable code, at least temporarily, that is loaded to the memory 106 from another memory device, such as another memory 106 or storage memory 114, for access by one or more of the processors 104. The data or processor-executable code loaded to the memory 106 may be loaded in response to execution of a function by the processor 104.

The storage memory interface 110 and the storage memory 114 may work in unison to allow the computing device 100 to store data and processor-executable code on a non-volatile storage medium. The storage memory 114 may be configured much like an embodiment of the memory 106 in which the storage memory 114 may store the data or processor-executable code for access by one or more of the processors 104. The storage memory 114, being non-volatile, may retain the information after the power of the computing device 100 has been shut off. When the power is turned back on and the computing device 100 reboots, the information stored on the storage memory 114 may be available to the computing device 100. The storage memory interface 110 may control access to the storage memory 114 and allow the processor 104 to read data from and write data to the storage memory 114.

Some or all of the components of the computing device 100 and/or the SoC 102 may be arranged differently and/or combined while still serving the functions of the various embodiments. The computing device 100 may not be limited to one of each of the components, and multiple instances of each component may be included in various configurations of the computing device 100.

For ease of reference, the terms "multicore processor," "processor," and "processor core" may be used interchangeably herein. The descriptions herein of the illustrated computing device and its various components are only meant to be exemplary and in no way limiting. Several of the components of the illustrated example computing device may be variably configured, combined, and separated. Several of the components may be included in greater or fewer numbers, and may be located and connected differently within the SoC or separate from the SoC.

Figure 2:
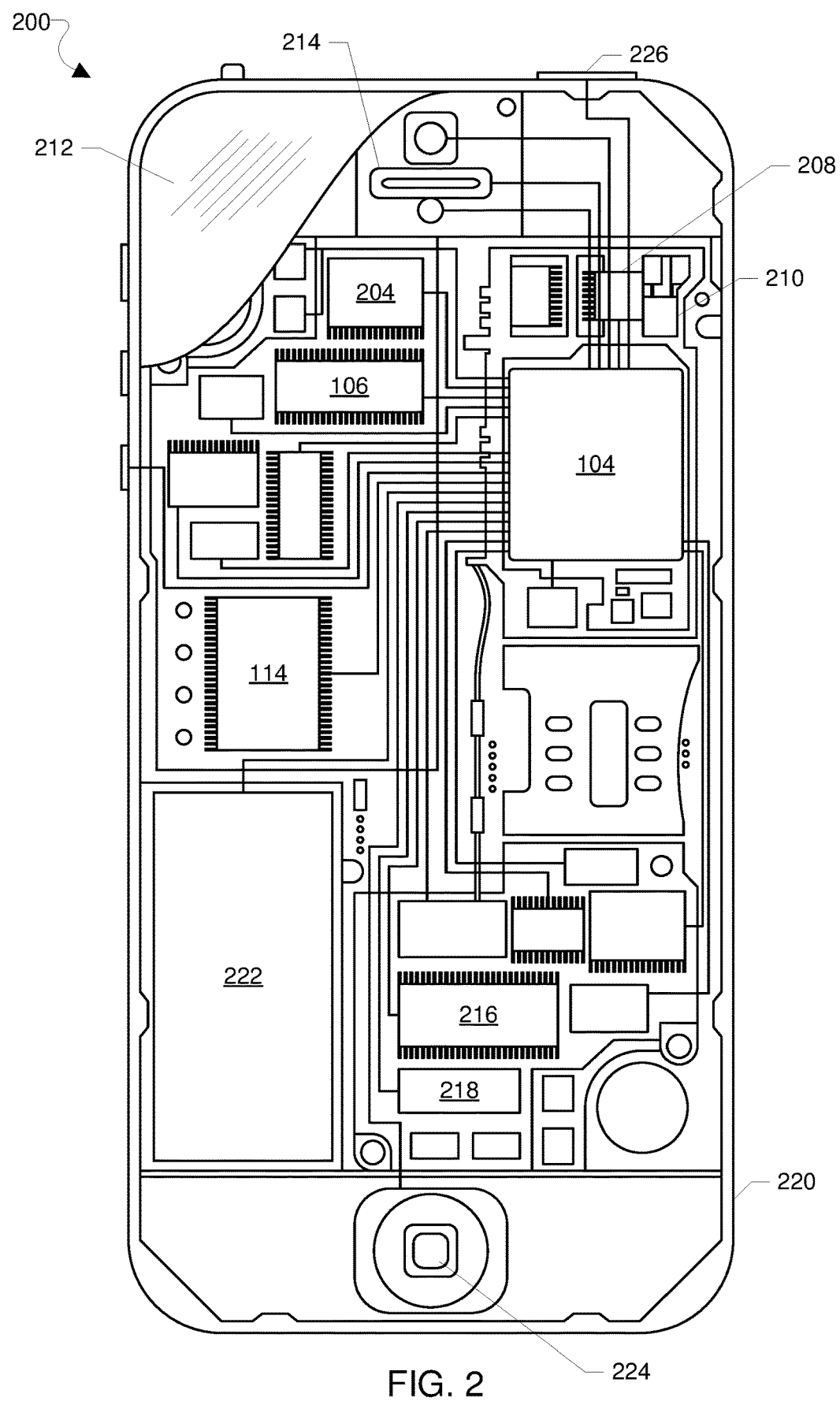
FIG. 2 is a component block diagram illustrating an example mobile computing device suitable for use with the various embodiments.

The various embodiments described herein may be implemented in a wide variety of computing devices 100 and systems including mobile computing devices, an example of which suitable for use with the various embodiments is illustrated in FIG. 2. The mobile computing device 200 may include a processor 104 coupled to a touchscreen controller 204 and an internal memory 106, 114. The processor 104 may be one or more multicore integrated circuits designated for general or specific processing tasks. The internal memory 106, 114 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 204 and the processor 104 may also be coupled to a touchscreen panel 212, such as a resistive-sensing touchscreen, capacitive-sensing touchscreen, infrared sensing touchscreen, etc. Additionally, the display of the mobile computing device 200 need not have touch screen capability.

The mobile computing device 200 may have one or more radio signal transceivers 208 (e.g., Peanut, Bluetooth, Zig-Bee, Wi-Fi, RF radio) and antennae 210, for sending and receiving communications, coupled to each other and/or to the processor 104. The transceivers 208 and antennae 210 may be used with the above-mentioned circuitry to implement the various wireless transmission protocol stacks and interfaces. The mobile computing device 200 may include a cellular network wireless modem chip 216 that enables communication via a cellular network and is coupled to the processor.

The mobile computing device 200 may include a peripheral device connection interface 218 coupled to the processor 104. The peripheral device connection interface 218 may be singularly configured to accept one type of connection, or may be configured to accept various types of physical and communication connections, common or proprietary, such as Universal Serial Bus (USB), FireWire, Thunderbolt, or PCIe. The peripheral device connection interface 218 may also be coupled to a similarly configured peripheral device connection port (not shown).

The mobile computing device 200 may also include speakers 214 for providing audio outputs. The mobile computing device 200 may also include a housing 220, constructed of a plastic, metal, or a combination of materials, for containing all or some of the components described herein. The mobile computing device 200 may include a power source 222 coupled to the processor 104, such as a disposable or rechargeable battery. The rechargeable battery may also be coupled to the peripheral device connection port to receive a charging current from a source external to the mobile computing device 200. The mobile computing device 200 may also include a physical button 224 for receiving user inputs. The mobile computing device 200 may also include a power button 226 for turning the mobile computing device 200 on and off.

Figure 3:
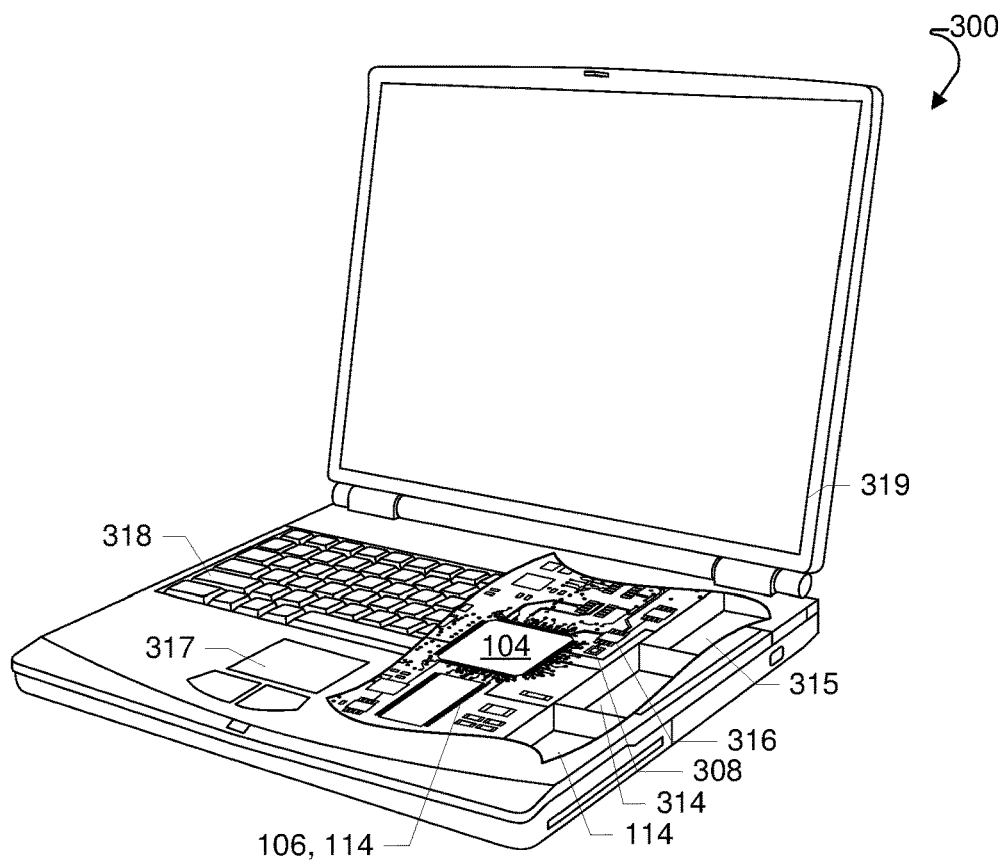
FIG. 3 is a component block diagram illustrating an example mobile computing device suitable for use with the various embodiments.

The various embodiments described herein may be implemented in a wide variety of computing devices 100 and systems including a laptop computer 300 an example of which is illustrated in FIG. 3. Many laptop computers include a touchpad touch surface 317 that serves as the computer's pointing device, and thus may receive drag, scroll, and flick gestures similar to those implemented on computing devices equipped with a touch screen display and described above. A laptop computer 300 will typically include a processor 104 coupled to volatile memory 106, 114 and a large capacity nonvolatile memory 114, such as a disk drive of Flash memory. Additionally, the computer 300 may have one or more antenna 308 for sending and receiving electromagnetic radiation that may be connected to a wireless data link and/or cellular telephone transceiver 316 coupled to the processor 104. The computer 300 may also include a floppy disc drive 314 and a compact disc (CD) drive 315 coupled to the processor 104. In a notebook configuration, the computer housing includes the touchpad 317, the keyboard 318, and the display 319 all coupled to the processor 104. Other configurations of the computing device may include a computer mouse or trackball coupled to the processor (e.g., via a USB input) as are well known, which may also be used in conjunction with the various embodiments.

Figure 4:
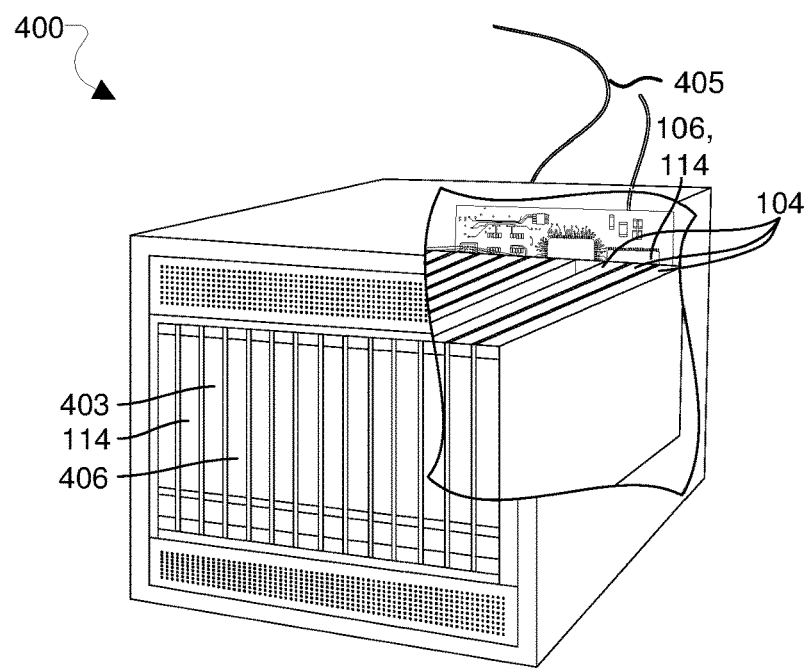
FIG. 4 is a component block diagram illustrating an example server suitable for use with the various embodiments.

The various embodiments described herein may also be implemented in fixed computing devices 100 or systems, such as any of a variety of commercially available servers. An example server 400 is illustrated in FIG. 4. Such a server 400 typically includes one or more multicore processor assemblies 104 coupled to volatile memory 106, 114 and a large capacity nonvolatile memory 114, such as a disk drive. As illustrated in FIG. 4, multicore processor assemblies 104 may be added to the server 400 by inserting them into the racks of the assembly. The server 400 may also include a floppy disc drive, compact disc (CD) or digital versatile disc (DVD) disc drive 406 coupled to the processor 104. The server 400 may also include network access ports 403 coupled to the multicore processor assemblies 104 for establishing network interface connections with a network 405, such as a local area network coupled to other broadcast system computers and servers, the Internet, the public switched telephone network, and/or a cellular data network (e.g., CDMA, TDMA, GSM, PCS, 3G, 4G, LTE, or any other type of cellular data network).

Figure 5A:
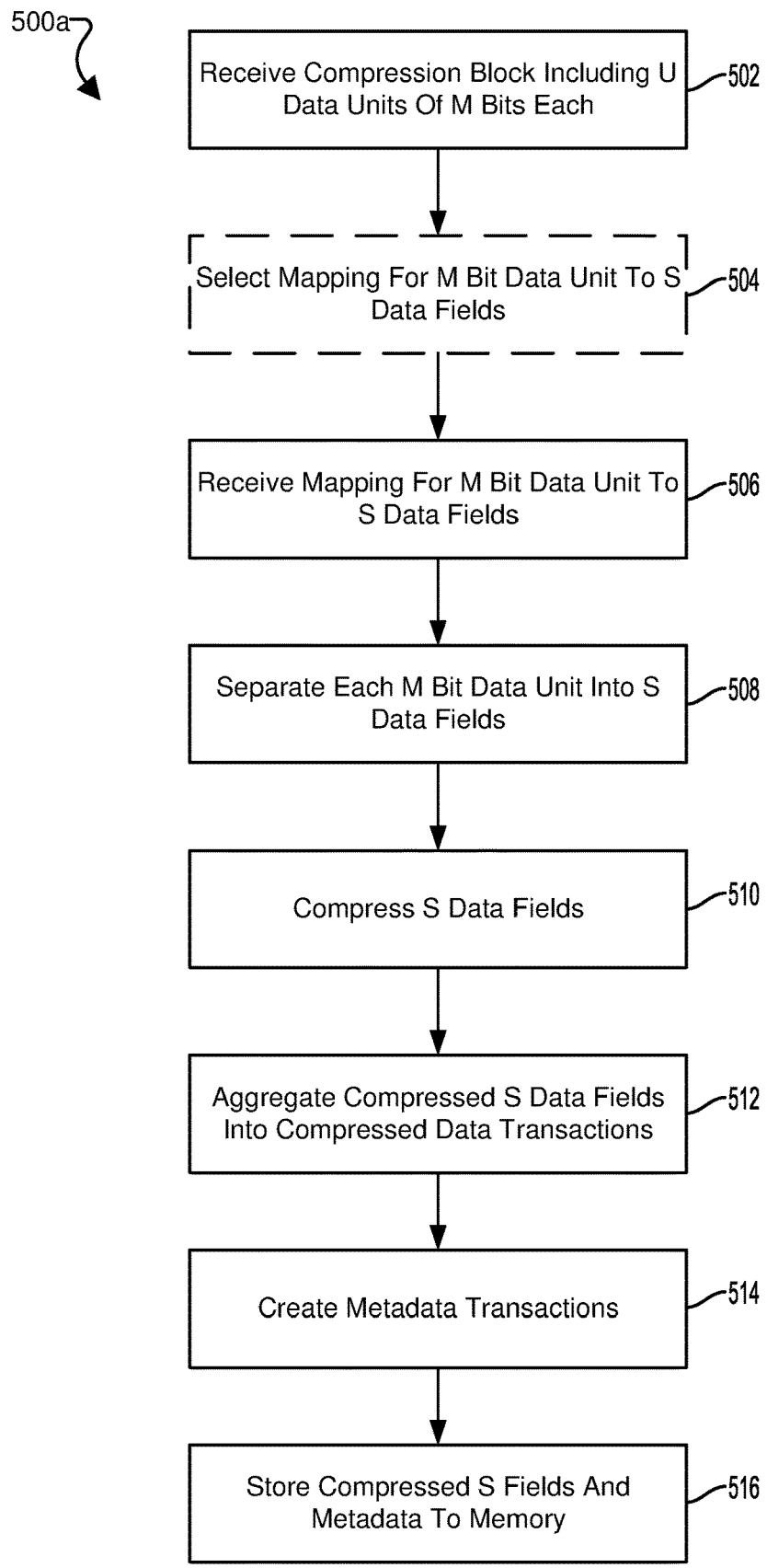
FIGS. 5A and 5B are process flow diagrams illustrating a method for compression of high dynamic ratio fields for machine learning according to some embodiments.
Figure 5B:
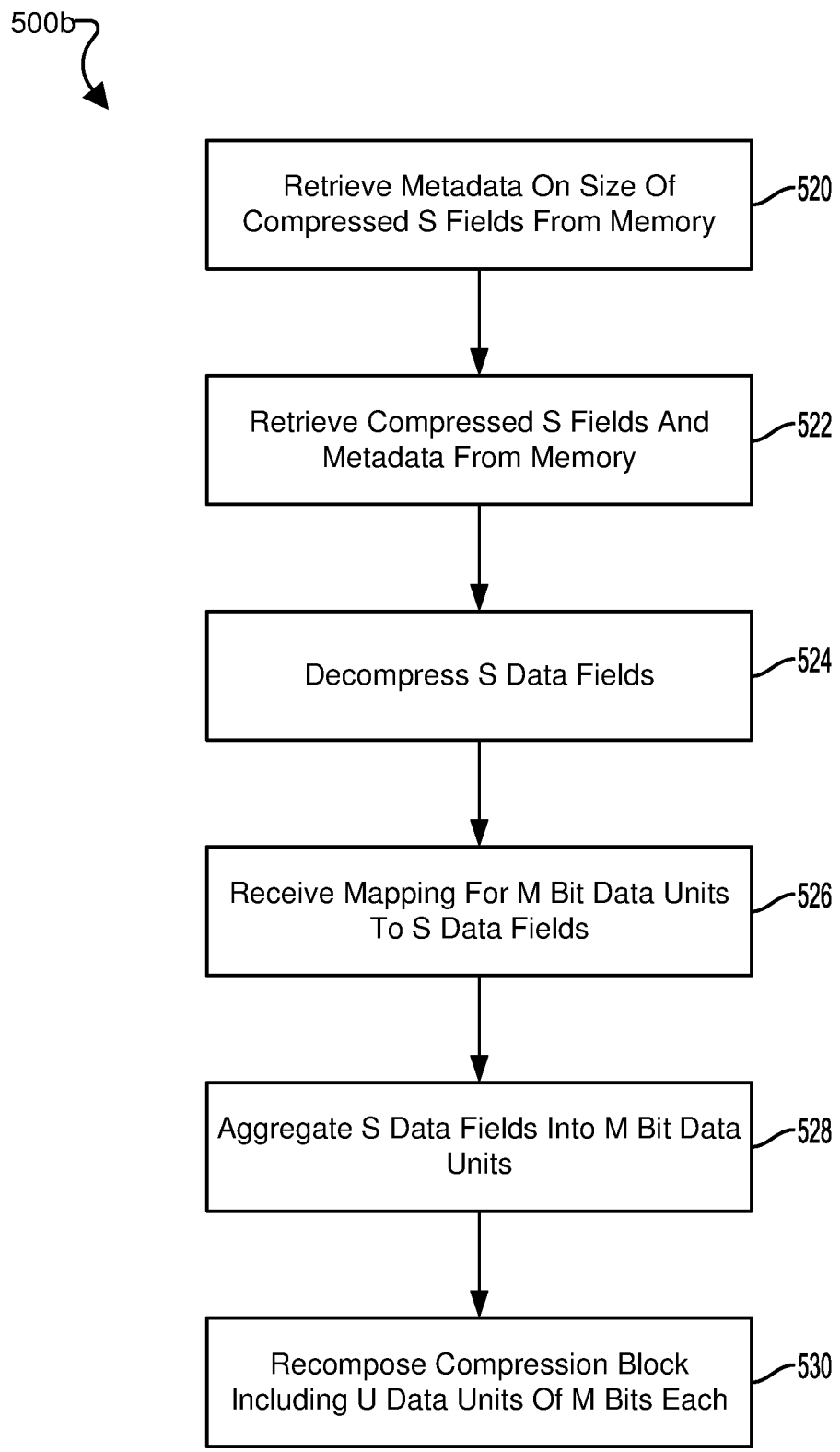

FIGS. 5A and 5B illustrate methods 500a, 500b for compression of high dynamic ratio fields of data, such as data for and/or generated by machine learning according to some embodiments. With reference to FIGS. 1-5B, the methods 500a, 500b may be implemented in a computing device (e.g., 100), in software executing in a processor (e.g., 104), in general purpose hardware, in dedicated hardware, or in a combination of a software-configured processor and dedicated hardware, such as a processor executing software within a system for compression of high dynamic ratio fields for machine learning that includes other individual components (e.g., memory 106, 114), and various memory/cache controllers. In order to encompass the alternative configurations enabled in various embodiments, the hardware implementing the methods 500a, 500b is referred to herein as a "processing device."

As used herein, the term "compression block" refers to a unit or block of data that is to be compressed (or decompressed) in one or a series of compression operations using the same compression technique. For example, a sequence of data may include blocks or portions of the data having a similar source or characteristics, and thus appropriate for compressing using the same compression methods and organization. As another example, a large data file to be compressed may be broken into arbitrary blocks or chunks before compression processing. Accordingly, the method 500a may be used to compress a compression block of K bytes of data, where K is an arbitrary number that may depend on the nature of the data, characteristics within a stream of data, or a source of data, such as activation and/or weight data for/from machine learning. More generally as processing units of data may be larger than bytes, a compression block of K bytes of data may include U number of data units, each of M bits in size (e.g., 8 bits, 16 bits, 32 bits, 64 bits, etc.).

In block 502 the processing device may receive a compression block.

In optional block 504, the processing device may select a mapping of the M bit data units to S number of data fields. For example, M is 16, S may be 2 data fields (e.g., two 8-bit fields) or 3 data fields (e.g., a 4-bit first data field, a 4-bit second data field, and an 8-bit third data field). In some embodiments, a size for a data field may be limited by a quantum of N bits for which a compression hardware and/or software is configured to compress. In some embodiments, the mapping may be selected from preconfigured mappings stored in a memory. The mappings may be selected based on various parameters, such as size and/or type of data units in the compression block, how frequently portions of the data units mapped to different ones of the data fields are likely to vary within the compression block, referred to herein as locality of the data, and/or expected or estimated compression ratios suitable or achievable for portions of the data units mapped to different ones of the data fields. For example, there may be very slow-changing value locality 16-bit fixed point type data in the most significant bits (MSBs) compared to the least significant bits (LSBs), making the most significant bits of the data more compressible than the least significant bits of the data. In another example, in 16-bit floating point type data, exponent and sign bits may vary very slowly compared to fraction bits (also referred to as significand or mantissa). For 16-bit and larger data, there may be opportunities to increase compression ratios due to a slow-changing locality (e.g., setting S=3 so the 4 MSBs can be compressed using a more robust compression method than used for bits with faster-changing localities, like the 12 lower significant bits and especially the 8 LSBs).

In various embodiments, the mapping of each M bit data unit to S number of data fields may depend upon the nature of the data, the source of the data, the operations being performed on the data, and/or the data compression hardware and algorithms. In some embodiments, the mapping may be selected based on a workload for a machine learning algorithm. In some embodiments, the mapping may be selected based on a type of data to be compressed. In some embodiments, the mapping may be selected based on the number of hidden layers and/or the hidden layer in a machine learning algorithm that is to be compressed. In some embodiments, the mapping may be selected based on a type and/or availability of a compression engine. In some embodiments, the mapping may be selected based on ongoing training of a machine learning algorithm and/or a directed search engine configured to provide mappings for the received compression block.

In block 506, the processing device may receive a mapping for each M bit data unit to an S number of data fields, in which S is two or more, to generate S sets of data fields. For example, if S is equal to 2, the mapping may configure bits of each data unit with a compression block into two data fields to generate a first set of data fields and a second set of data fields encompassing all bits within the compression block. In some embodiments, the received mapping may be the mapping of the M bit data units to S number of data fields selected by the processing device in optional block 504. In some embodiments, such as when optional block 504 is not implemented, the processing device may receive a mapping that is predetermined for the compression block and its data units. For example, a mapping of the M bit data units to S number of data fields may be previously associated with a compression block (i.e., a unit or block of data to be compressed in the same way) based on various parameters, such locality of the data. In some embodiments, the mapping may be previously associated with a compression block based on a workload for a machine learning algorithm. In some embodiments, the mapping of the M bit data units to S number of data fields may be previously associated with a compression block based on a type of data to be compressed. In some embodiments, the mapping may be previously associated with a compression block based on the number of hidden layers and/or which hidden layer in a machine learning algorithm that is to be compressed. In some embodiments, the mapping may be previously associated with a compression block based on a type and/or availability of a compression engine. In some embodiments, the mapping may be previously associated with a compression block based on the machine learning algorithm with which the compression block is associated.

Whether determined in optional block 504 or received in block 506, the mapping of the M bit data units to S number of data fields may be flexible and dynamic as described in more detail below. The mappings may be arbitrary in that bits of the data units mapped to the same data field may be from any part of the data unit, and the data fields may be of any size and number. The mapping may group together bits of data units with specific data fields based on a compression ratio that is expected to be achieved by compressing the data fields. For example, bits of each data unit with locality above or below a locality threshold may be grouped together. The bits of the data units with locality above the locality threshold may have high locality so that the values of the grouped bits may not vary much and are compressible to a higher degree than the bits of the data units with locality below the locality threshold and may vary more.

In optional block 508, the processing device may separate each of the M bit data units within the compression block into the S number of sets of data fields as indicated by the mapping. In some embodiments, the processing device may be configured to compress data fields of a specified size. For data fields including less than the specified number of bits mapped from the data units, the processing device may add padding bits to the data fields to ensure that the data fields are of the specified size and that the processing device may compress the data fields. Block 508 is optional because operations of compressing in block 510 may be performed by using the mapping to extract data bits for compression from the data units without the need for separating data bits into data fields before compression.

In block 510, the processing device may compress the data fields within each set of data fields together to generate compressed sets of data fields. For example, if S is equal to 2 and the data map generates a first set of data fields and a second set of data fields, the processing device may compressing the first set of data fields together to generate a compressed first set of data fields, and compressing the second set of data fields together to generate a compressed second set of data fields. In some embodiments, the processing device may compress the data fields serially. In some embodiments, the processing device may compress data fields in parallel. The data fields compressed in parallel may be the same data fields from different data units. The data fields compressed in parallel may be different data fields from different data units. In some embodiments, the same data fields for various data units may be grouped and compressed together. The compressed data fields may include data and information bits. The information bits may include information related to the data of the compressed data fields, such as data type and data size. In some embodiments, each set of data fields may be compressed using a different compression method. The processing device may generate metadata for the compressed data fields that may include information regarding how the data fields were compressed, how the data fields were grouped, how the data units were mapped to the data fields, and/or the size of the compressed data fields. As discussed further herein, this metadata may be used to decompress the compressed data fields and reconstruct the compression block.

In block 512, the processing device may aggregate the compressed data fields into a number of memory access transactions, referred to herein as compressed data transactions. In some embodiments, the processing device may aggregate the compressed data fields into compressed data transactions based on various parameters, such as bandwidth and/or memory usage and/or availability. In some embodiments, the processing device may aggregate the compressed data fields into compressed data transactions based on expected access to data within certain compressed data fields. For example, data likely to be accessed together may be aggregated. In another example, like data may be aggregated. The compressed data transactions may further include the metadata from the compressed data fields of the compressed data transactions.

In block 514, the processing device may generate metadata transactions. The metadata transactions may include metadata relating to the compressed data transactions, such as size and/or type of compressed data transaction.

In block 516, the processing device may store the compressed data fields and the metadata associated with the compressed data transactions in a memory. The compressed data transactions and the metadata transactions may be implemented to store the compressed data fields and the associated metadata, and the metadata associated with the compressed data transactions in the memory. In some embodiments, the compressed data fields, the associated metadata, and the metadata associated with the compressed data transactions may be stored separately in the memory.

The method 500b may be performed to decompress data that has been compressed according to the method 500a according to various embodiments. In block 520 the processing device may retrieve metadata on the size of the compressed data fields from the memory. The processing device may read the metadata stored in response to the compressed data transactions for the compressed data fields to retrieve the size of the compressed data fields.

In block 522 the processing device may retrieve the compressed data fields and the associated metadata from the memory. The processing device may use the metadata on the size of the compressed data fields as parameters for retrieving the stored compressed data fields. In some embodiments, retrieval of the compressed data fields and the associated metadata may be triggered by implementation of a machine learning algorithm for which the compressed data fields are activation and/or weight data.

In block 524, the processing device may decompress the compressed data fields retrieved from the memory. In some embodiments, decompression operations may be based upon the type of compression used with each data fields as identified in the metadata associated with the compressed data fields. For example, the metadata may identify the compression used to compress the compressed data fields, and thus the decompression process to use to recover the data in the compressed data fields. Like the compression process, the decompression process may decompress the compressed data fields serially and/or in parallel. For example, the compressed data fields may be decompressed in the same order as the compression of the data fields.

In block 526, the processing device may receive the mapping for the data units to the data fields. In some embodiments, the mapping may be identified by the metadata associated with the compressed data fields. In some embodiments, the mapping may be predetermined in the same manner as the predetermined mapping used to map the splitting of the data units into data fields.

In block 528, the processing device may aggregate the data fields into the data units once the data fields are decompressed. The processing device may use the metadata for the compressed data fields to determine the data units and the order of the data units used to compose the data fields as in block 510.

In block 530, the processing device may recompose the compression blocks from the decompressed data fields. The processing device may use the received mapping to determine which data units were mapped to which data fields and reconstruct the compression block by reversing the mapping, placing the data units in the order they were in prior to separating the data units into the data fields in block 508.

Figure 6A:
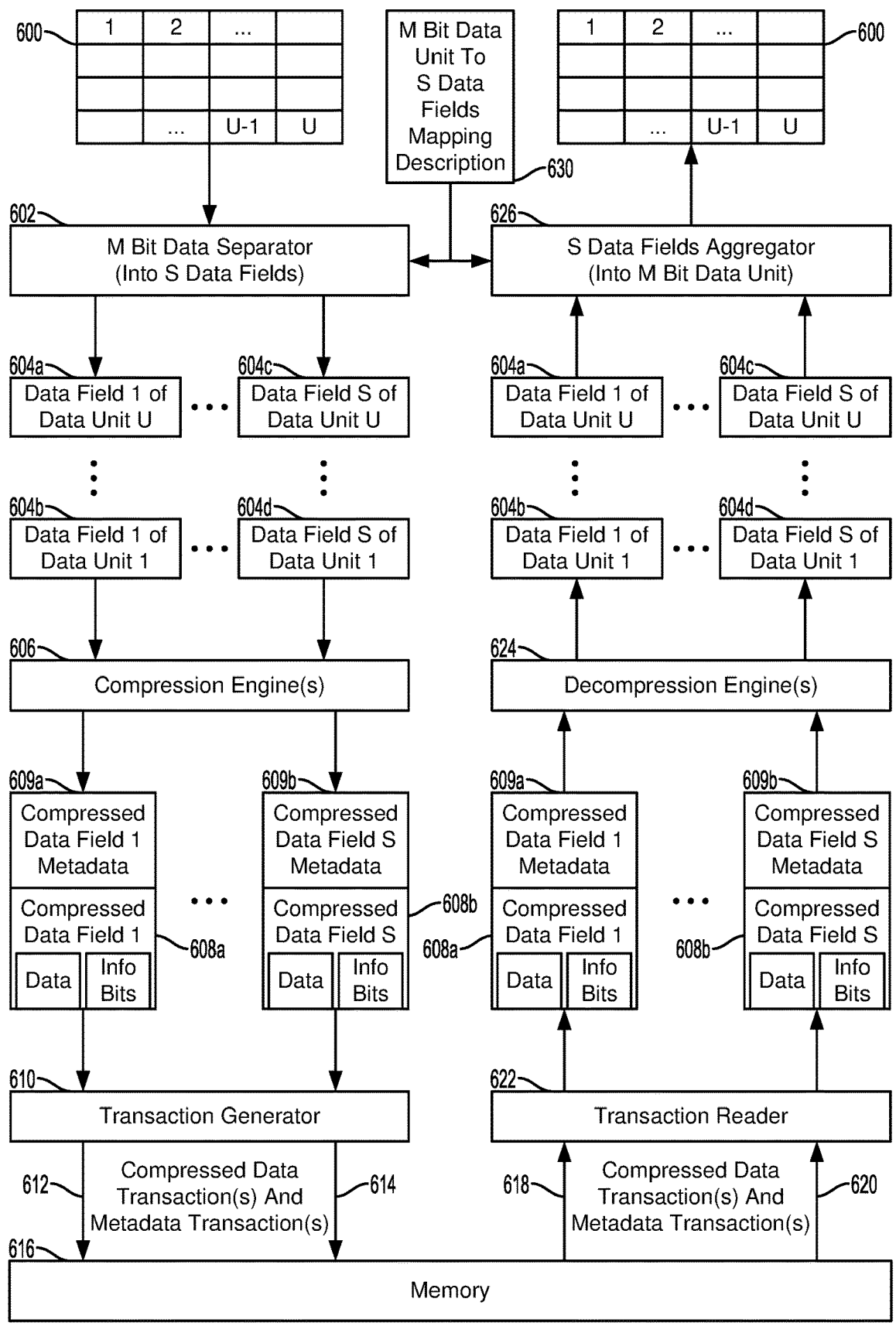
FIGS. 6A and 6B are component flow diagrams illustrating a method for compression of high dynamic ratio fields for machine learning according to some embodiments.
Figure 6B:
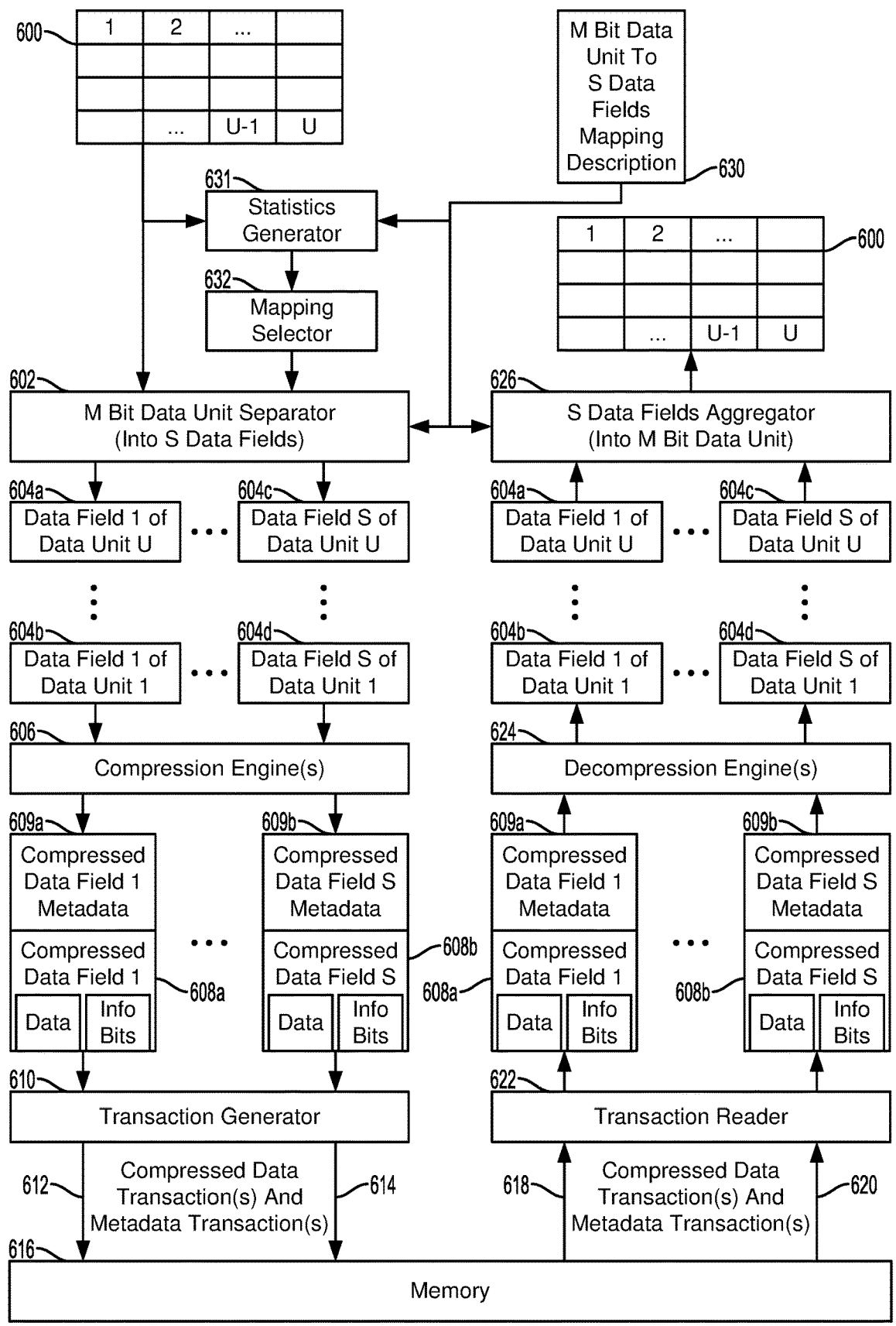

FIGS. 6A and 6B are component flow diagrams illustrating two alternative methods for compression of high dynamic ratio fields for machine learning according to some embodiments. A computing device (e.g., computing device 100 in FIGS. 1-4) may include a data unit separator 602, a compression engine 606, a transaction generator 610, a memory 616, a transaction reader 622, a decompression engine 624, a data fields aggregator 626, and a data unit to data fields mapping description 630. In some embodiments, any combination of the data unit separator 602, the compression engine 606, the transaction generator 610, the transaction reader 622, the decompression engine 624, and the data fields aggregator 626 may be implemented in dedicated hardware. In some embodiments, any combination of the data unit separator 602, the compression engine 606, the transaction generator 610, the transaction reader 622, the decompression engine 624, and the data fields aggregator 626 may be implemented in software configured to specifically program a processor to execute the software. In some embodiments the data unit to data fields mapping description 630 may be stored in a memory (e.g., memory 616 in FIG. 6).

The data unit separator 602 may be configured to receive a compression block 600. The compression block 600 may include U number of data units, each of M bits in size. The data unit separator 602 may select a mapping to map each M bit data unit to an S number of data fields 604a, 604b, 604c, 604d. In some embodiments, the mapping may be selected from preconfigured mappings from the data unit to data fields mapping description 630. The mappings may be selected based on various parameters, such as described herein with reference to optional block 504 of the method 500a (FIG. 5A).

The data unit separator 602 may be configured to receive a mapping for the M bit data elements to an S number of data fields 604a, 604b, 604c, 604d. In some embodiments, the received mapping may be the mapping selected by the data unit separator 602 from the data unit to data fields mapping description 630. In some embodiments, the received mapping may be a predetermined mapping for the compression block 600 and its data units received from the data unit to data fields mapping description 630. For example, a mapping may be previously associated with a compression block 600 based on various parameters similar to the various parameters for selecting the mapping.

The data unit separator 602 may be configured to separate each of the data units into the S number of data fields 604a, 604b, 604c, 604d as indicated by the mapping. The mapping may indicate which bits of the data unit are mapped to which data fields 604a, 604b, 604c, 604d, and the data unit separator 602 may separate the bits of each data unit and group the bits in their mapped data fields 604a, 604b, 604c, 604d. The mapping may group bits of data unit with specific data fields 604a, 604b, 604c, 604d based on a compression ratio that is expected to be achieved by compressing the data fields 604a, 604b, 604c, 604d. For example, bits of each data unit with locality above or below a locality threshold may be grouped together. The bits of the data unit with locality above the locality threshold may have high locality so that the values of the grouped bits may not vary much and are compressible to a higher degree than the bits of the data unit with locality below the locality threshold and that vary more. The mappings may be arbitrary in that bits of the data units mapped to the same data field 604a, 604b, 604c, 604d may be from any part of a data unit, and the data fields 604a, 604b, 604c, 604d may be of any size and number. In some embodiments, the size for a data fields 604a, 604b, 604c, 604d may be limited by a quantum of N bits for the compression engine 606.

In some embodiments, the compression engine 606 may be configured to compress data fields 604a, 604b, 604c, 604d of a specified size, i.e., a quantum of N bits. For data fields 604a, 604b, 604c, 604d including less than the specified number of bits mapped from the data units, the data unit separator 602 may add padding bits to the data fields 604a, 604b, 604c, 604d to ensure that the data fields 604a, 604b, 604c, 604d are of the specified size for the compression engine 606 to compress the data fields 604a, 604b, 604c, 604d.

The compression engine 606 may be configured to compress the data fields 604a, 604b, 604c, 604d. In some embodiments, the compression engine 606 may compress the data fields 604a, 604b, 604c, 604d serially. In various embodiments, multiple compression engines 606 may compress data fields 604a, 604b, 604c, 604d in parallel. The data fields 604a, 604b, 604c, 604d compressed in parallel may be the same data fields 604a, 604b, 604c, 604d for different data units. The data fields 604a, 604b, 604c, 604d compressed in parallel may be different data fields 604a, 604b, 604c, 604d for different data units. In some embodiments, the same data fields 604a, 604b, 604c, 604d for various data units may be grouped and compressed together. For example, data fields 604a and 604c may be grouped and compressed together to generate compressed data field 608a, and data fields 604b and 604d may be grouped and compressed together to generate compressed data field 608b. The compressed data fields 608a, 608b may include data and information bits (Info Bits in FIGS. 6A and 6B). The information bits may include information related to the data of the compressed data fields, such as data type and data size. The compression engine 606 may generate metadata 609a, 609b for the compressed data fields 608a, 608b that may include information as to how the data fields 604a, 604b, 604c, 604d were compressed, how the data fields 604a, 604b, 604c, 604d were grouped, how the data units were mapped to the data fields 604a, 604b, 604c, 604d, and/or the size of the compressed data fields 608a, 608b. As discussed further herein, the metadata 609a, 609b may be used to decompress the compressed data fields 608a, 608b and reconstruct the compression block 600.

The transaction generator 610 may aggregate the compressed data fields 608a, 608b into a number of memory access transactions, referred to herein as compressed data transactions 612. In some embodiments, the transaction generator 610 may aggregate the compressed data fields 608*a*, 608*b* into compressed data transactions 612 based on various parameters, such as bandwidth and/or memory usage and/or availability. In some embodiments, the transaction generator 610 may aggregate the compressed data fields 608*a*, 608*b* into compressed data transactions 612 based on expected access to data within certain compressed data fields 608*a*, 608*b*. For example, data likely to be accessed together may be aggregated in a compressed data transaction 612. In another example, like data may be aggregated in a compressed data transaction 612. The compressed data transactions 612 may further include the metadata 609*a*, 609*b* from the compressed data fields 608*a*, 608*b* of the compressed data transactions 612. The transaction generator 610 may further generate metadata transactions 614. The metadata transactions 614 may include metadata relating to the compressed data transactions 612, such as size and/or type of compressed data transaction 612. The transaction generator 610 may store the compressed data fields 608*a*, 608*b* and the associated metadata 609*a*, 609*b*, and the metadata associated with the compressed data transactions 612 to the memory 616. The compressed data transactions 612 and the metadata transactions 614 may be implemented to store the compressed data fields 608*a*, 608*b* and the associated metadata 609*a*, 609*b*, and the metadata associated with the compressed data transactions 612 to the memory 616. The metadata associated with the compressed data transactions 612, the compressed data fields 608*a*, 608*b*, and the associated metadata 609*a*, 609*b* may be stored separately in the memory 616. Storing the metadata 609*a*, 609*b* separately from the compressed data fields 608*a*, 608*b* may allow for retrieval of the metadata 609*a*, 609*b* prior to retrieval of the compressed data fields 608*a*, 608*b*. The retrieved metadata 609*a*, 609*b* may include the size of the compressed data fields, which may be used as a parameter for retrieving the compressed data fields 608*a*, 608*b* in the memory 616.

In data transactions 618 and 620, the transaction reader 622 may retrieve the metadata associated with the compressed data transactions 612, and the compressed data fields 608*a*, 608*b* and the associated metadata 609*a*, 609*b* from the memory 616. The metadata 609*a*, 609*b*, including the size of the compressed data fields, may be retrieved prior to the compressed data fields 608*a*, 608*b*, and may be used as a parameter for retrieving the compressed data fields 608*a*, 608*b*. In some embodiments, retrieval data transactions 618, 620 of the metadata associated with the compressed data transactions 612, and the compressed data fields 608*a*, 608*b* and the associated metadata 609*a*, 609*b* may be triggered by implementation of a machine learning algorithm for which the compressed data fields 608*a*, 608*b* are activation and/or weight data.

The decompression engine 624 may decompress the compressed data fields 608*a*, 608*b* retrieved from the memory 616. In some embodiments, decompression may be informed by the metadata 609*a*, 609*b* associated with the compressed data fields 608*a*, 608*b*. In some embodiments, decompression may be informed by the information bits of the compressed data fields 608*a*, 608*b*. For example, the metadata 609*a*, 609*b* may inform the decompression process as to what compression was used to compress the compressed data fields 608*a*, 608*b*. Like the compression process, the decompression process may decompress the compressed data fields 608*a*, 608*b* serially and/or in parallel. To decompress the compressed data fields 608*a*, 608*b* in parallel, the computing device may employ multiple decompression engines 624. For example, the compressed data fields 608*a*, 608*b* may be decompressed in the same order as the compression of the data fields 604*a*, 604*b*, 604*c*, 604*d*. Decompression of the compressed data fields 608*a*, 608*b* may result in the uncompressed data fields 604*a*, 604*b*, 604*c*, 604*d*.

The data fields aggregator 626 may receive the mapping for the data units to the data fields 604*a*, 604*b*, 604*c*, 604*d* from the data unit to data fields mapping description 630. In some embodiments, the mapping may be identified by the metadata 609*a*, 609*b* associated with the compressed data fields 608*a*, 608*b*. In some embodiments, the mapping may be predetermined in the same manner as the predetermined mapping used to map the splitting of the data units into data fields 604*a*, 604*b*, 604*c*, 604*d*.

The data fields aggregator 626 may aggregate the data fields 604*a*, 604*b*, 604*c*, 604*d* into the data units once the data fields 604*a*, 604*b*, 604*c*, 604*d* are decompressed. The data fields aggregator 626 may use the metadata 609*a*, 609*b* for the compressed data fields 608*a*, 608*b* to determine the data units and the order of the data units to use in recomposing the data fields 604*a*, 604*b*, 604*c*, 604*d*. The data fields aggregator 626 may recompose the compression block 600 including the data units of the compression block 600. The data fields aggregator 626 may use the received mapping, from the data unit to data fields mapping description 630, to determine the data units that were mapped to the data fields 604*a*, 604*b*, 604*c*, 604*d* and reconstruct the compression block 600 by reversing the mapping, placing the data units in the order they were in prior to separating the data units into the data fields 604*a*, 604*b*, 604*c*, 604*d*.

In addition to the processing units and operations described above with reference to FIG. 6A, in some embodiments the computing device may further include a statistics generator 631 and a mapping selector 632 as illustrated in FIG. 6B. In some embodiments, any combination of the statistics generator 631 and the mapping selector 632 may be implemented in dedicated hardware.

As described above, the mapping of each M bit data unit to S number of data fields may be selected based on various parameters, including locality of the data. In some embodiments, the locality of the data may not be known prior to selecting a mapping for the compression block 600. To address this, in embodiments illustrated in FIG. 6B, a statistics generator 631 may be configured to receive and analyze the compression block 600 to determine the locality of bits and/or ranges of the various data units of the compression block 600. The statistics generator 631 may determine how frequently the bits in ranges of bits in the various data units vary between data units. Higher variability may indicate lower locality between the bits in a range of bits (e.g., in the 8 LSBs), and lower amounts of variability may indicate higher locality bits in a range of bits in the various data units (e.g., the 4 MSBs). The statistics generator 631 may receive a mapping from the data unit to data fields mapping description 630 and determine locality of the data for the mapping by determining the variability for the bits in a location or in a range of locations in the various data units as indicated by the mapping. The data unit to data fields mapping description 630 may include any number C of alternative mappings, and the statistics generator 631 may analyze any combination of the C mappings for a compression block 600. In some embodiments, the statistics generator 631 may determine the locality for any of the bits in a range of bits within the various data units as indicated by the mapping. In some embodiments, the statistics generator 631 may determine the locality for a mapping via any number various statistical analyses, include average, mean, linear regression, etc.

The mapping selector 632 may be configured to test mappings that are determined to have a higher locality than a locality threshold. The test may be configured to estimate the compression ratios for the various data fields of a mapping. Similar to determining a locality of a mapping, the mapping selector 632 may be configured to determine a compression ratio of a mapping. The mapping selector 632 may select a mapping with the highest compression ratio and provide the mapping to the data unit separator 602 for separating the data units of the compression block 600 into the data fields 604a, 604b, 604c, 604d. In some embodiments, the mapping selector 632 may select a mapping based on various parameters, such as described herein with reference to block 504 of the method 500a in FIG. 5A. In some embodiments, the mapping selector 632 may select a mapping that represents a compromise between complexity and compression efficiency (e.g., number of data fields vs. degree of compression achievable in each data field).

Figure 7:
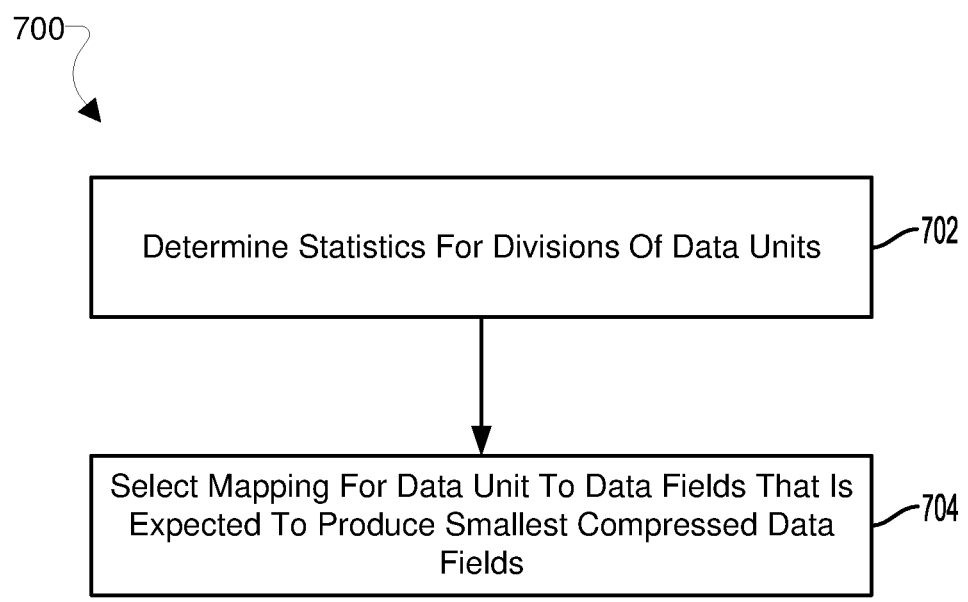
FIG. 7 is a process flow diagram illustrating selection of a mapping of data units to data fields according to some embodiments.

FIG. 7 illustrates a method 700 for selection of a mapping of data units to data fields according to some embodiments. With reference to FIGS. 1-7, the method 700 may be implemented in a computing device (e.g., 100), in software executing in a processor (e.g., 104), in general purpose hardware, in dedicated hardware, or in a combination of a software-configured processor and dedicated hardware, such as a processor executing software within a system for compression of high dynamic ratio fields for machine learning that includes other individual components (e.g., memory 106, 616), and various memory/cache controllers. In order to encompass the alternative configurations enabled in various embodiments, the hardware implementing the method 700 is referred to herein as a "processing device." In some embodiments, the method 700 may further describe select a mapping for the data units to an S number of data fields in optional block 504 of the method 500a in FIG. 5A.

In block 702, the processing device may determine statistics for divisions of data units of a compression block. In block 702, the processing device may analyze the compression block to determine the locality of bits and/or ranges of the various data units of the compression block. The processing device may determine how frequently the bits in a range of bits in the various data units vary between the data units. Higher amounts of variability may indicate lower locality between the bits in a range of bits in the various data units, and lower amounts of variability may indicate higher locality bits in a location or in a range of locations in the various data units. The processing device may determine locality of the data for a mapping by determining the variability for the bits in a range of bits in the various data units as indicated by the mapping. The processing device may analyze any combination of mappings for a compression block. In some embodiments, the processing device may determine the locality for any of the bits in a range of bits in the various data units as indicated by a mapping. In some embodiments, the processing device may determine the locality for a mapping via any number various statistical analyses, include average, mean, linear regression, etc.

In block 704, the processing device may select a mapping for a data unit to data fields to use in compressing data fields that is estimated to produce the smallest compressed data fields. The processing device may test mappings that are determined to have a higher locality than a locality threshold. The test may be configured to estimate the compression ratios for the various data fields of a mapping. Similar to determining a locality of a mapping, the processing device may be configured to determine a compression ratio of a mapping. For example, mappings with higher locality than other mappings may map show changing data bits to data fields that can be compressed with a higher compression ratio than the other mappings due to the consistency of the data bits. As such, the locality of the data may be indicative of the compression ratio of a mapping, and higher locality may be associated with higher compression ratios. The processing device may select a mapping with the highest estimated compression ratio. In some embodiments, the processing device may select a mapping based on a workload for a machine learning algorithm. In some embodiments, the processing device may select a mapping based on a type of data to be compressed. In some embodiments, the processing device may select a mapping based on the number of hidden layers and/or which hidden layer in a machine learning algorithm that is to be compressed. In some embodiments, the processing device may select a mapping based on a type and/or availability of a compression engine. In some embodiments, the processing device may select a mapping based on ongoing training of a machine learning algorithm and/or a directed search engine configured to provide mappings for the received compression block.

FIGS. 8A, 8B, 9, 10A, 10B, 11A, 11B, 12A, and 12B are block diagrams illustrating different example mappings of data units to data fields according to some embodiments. The examples illustrated in FIGS. 8A, 8B, 9, 10A, 10B, 11A, 11B, 12A, and 12B are not meant to limit the scope of the claims or the specification. Particularly, the size of the data units 800, 900, 1000, 1100, 1200 are merely illustrative, and other data units may be of any size and any type. The size of the data fields 802a, 802b, 802c, 802d, 802e, 802f, 902a, 902b, 1002a, 1002b, 1002c, 1002d, 1102a, 1102b, 1102c, 1102d, 1202a, 1202b, 1202c, 1202d, 1202e are merely illustrative, and other data fields may be of any size. The illustrated mappings of the bits of the data units 800, 900, 1000, 1100, 1200 to the locations in the data fields 802a, 802b, 802c, 802d, 802e, 802f, 902a, 902b, 1002a, 1002b, 1002c, 1002d, 1102a, 1102b, 1102c, 1102d, 1202a, 1202b, 1202c, 1202d, 1202e are merely illustrative, and bits of other data units may be mapped to any location in other data fields.

Figure 8A:
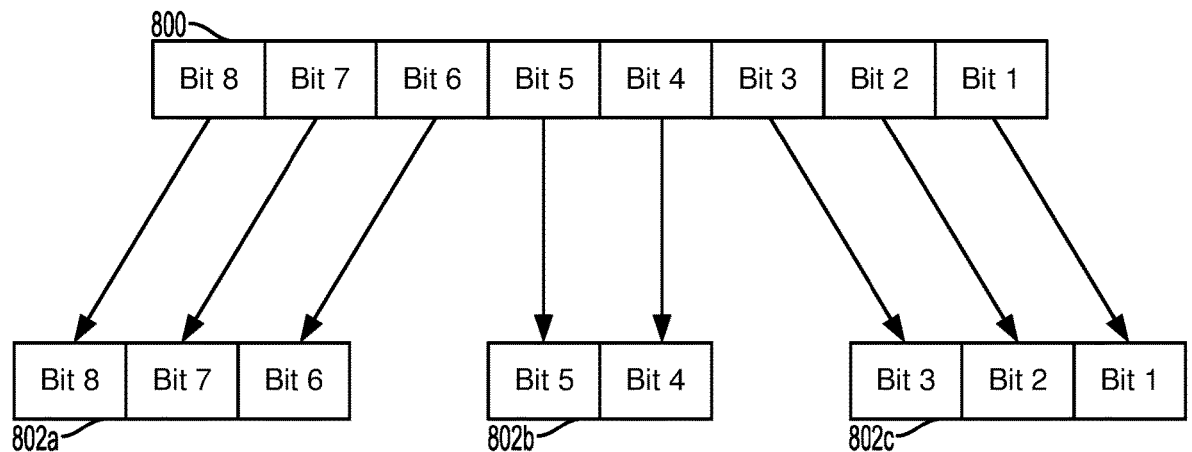
FIGS. 8A and 8B are block diagrams illustrating arbitrary mapping of data units to data fields according to some embodiments.
Figure 8B:
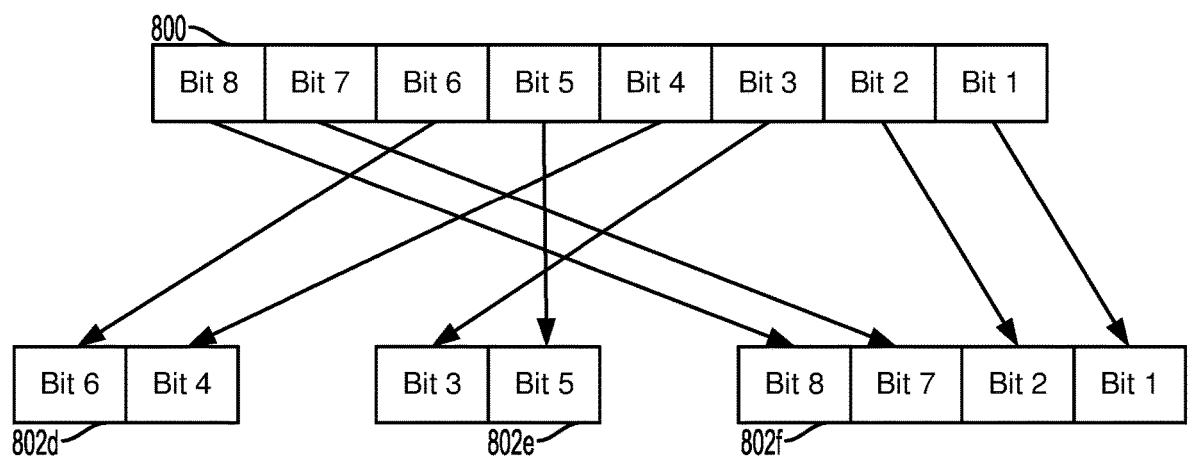
Figure 9:
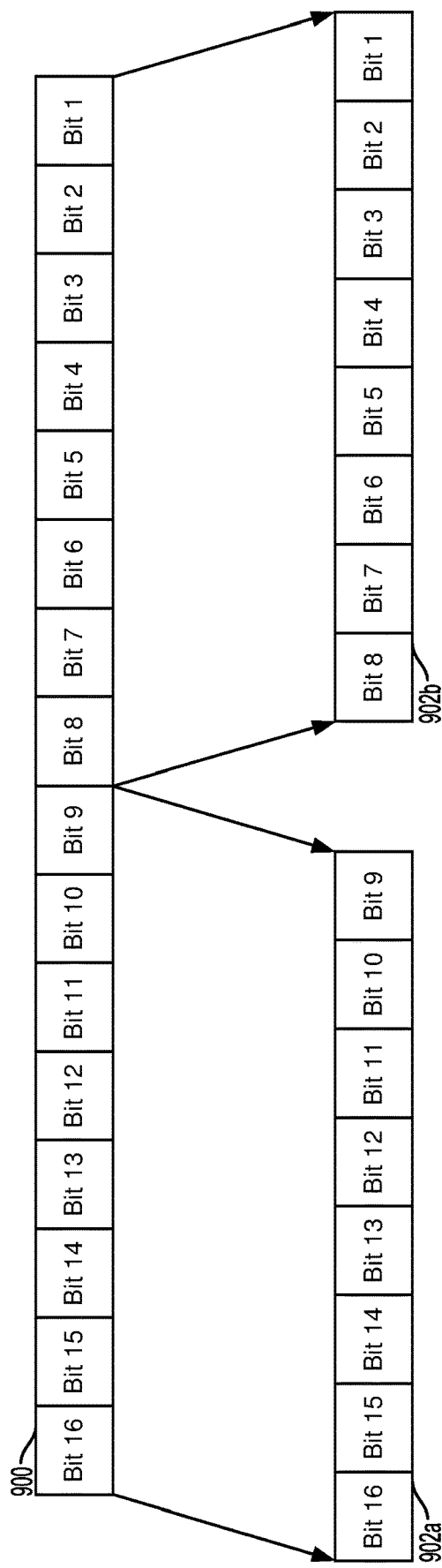
FIG. 9 is a block diagram illustrating an example mapping of a 16-bit fixed point type data unit to data fields according to some embodiments.

FIGS. 8A and 8B illustrate two examples mapping of 8 bits data units to 3 data fields according to some embodiments. The examples illustrated in FIGS. 8A and 8B include an 8-bit data unit 800. The example illustrated in FIG. 8A illustrates that the bits of the data unit 800 may be mapped to multiple data fields 802a, 802b, 802c of varying size, such as 3 bits, 2 bits, and 3 bits in this example. The example illustrated in FIG. 8B illustrates that the bits of the data unit 800 may be mapped to multiple data fields 802d, 802e, 802f of varying size and in any order FIG. 9 illustrates an example mapping of a 16-bit fixed point type data unit 900 into two 8-bit data fields 902a and 902b. As discussed above, there may be very slow-changing value locality 16-bit fixed point type data in the most significant bits compared to the least significant bits, making the most significant bits more compressible than the least significant bits. To take advantage of the higher locality in the most significant bits, bit 9 through bit 16 may be mapped to the data field 902a, and the least significant bits, bit 1 through bit 8, may be mapped to data field 902b. The data fields may be compressed separately such that compression of the higher locality of the bits mapped to data field 902a may achieve a higher compression ratio than the compression of the bits mapped to data field 902b.

Figure 10A:
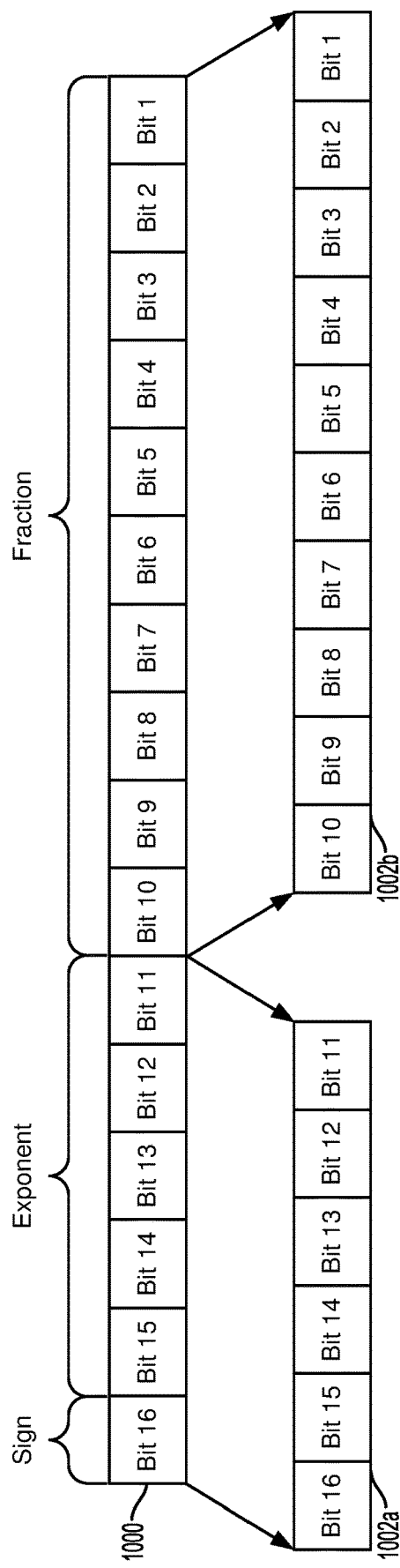
FIGS. 10A and 10B are block diagrams illustrating example mappings of 16-bit floating point data units to data fields according to some embodiments.
Figure 10B:
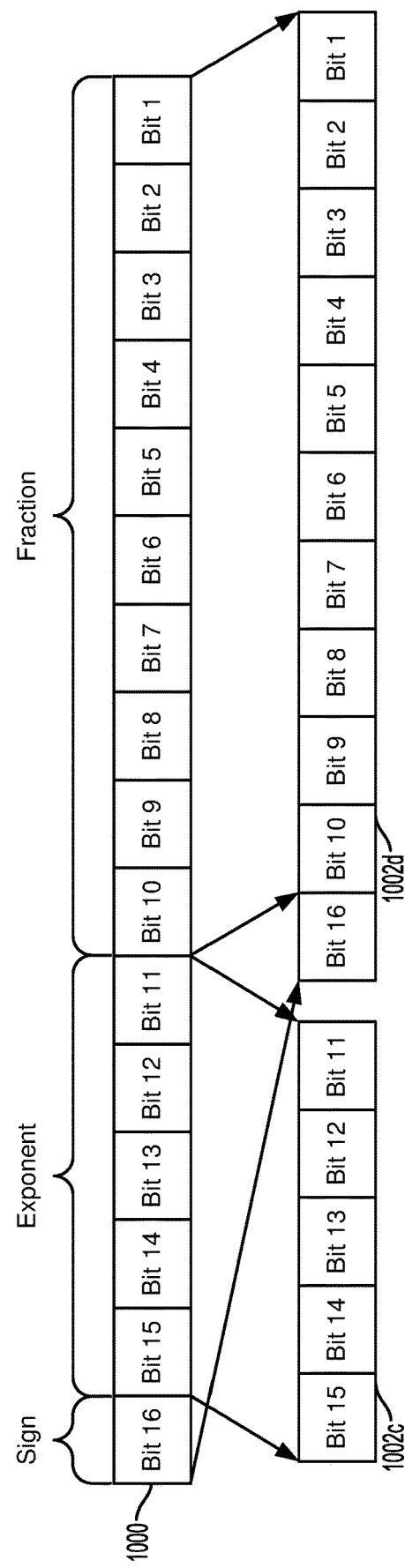

FIGS. 10A and 10B illustrate example mappings of a 16-bit floating point type data unit 1000 to two differently sized data fields 1002a and 1002b. As described, for 16-bit floating point type data, exponent and sign bits may vary very slowly compared to fraction bits (also referred to as significand or mantissa). To take advantage of the higher locality in the exponent and sign bits, bit 11 through bit 15 of the exponent and the sign bit 16 may be mapped to data field 1002a, and the lower locality faction bits, bit 1 through bit 10, may be mapped separately to data field 1002b.

The example illustrated in FIG. 10B shows a mapping of the 16-bit floating point number data unit 1000 to two differently sized data fields 1002c and 1002d. The locality of the high locality bits may be improved further, and as a result, the compression ratio of the high locality bits, by mapping the sign bit with the lower locality bits rather than with the higher locality bits. The higher locality bits in the exponent, bit 11 through bit 15 may be mapped to data field 1002c, and the lower locality faction bits, bit 1 through bit 10, and the sign bit, bit 16, may be mapped separately to data field 1002d. This example further illustrates that the bits of the data unit 1000 do not need to be mapped to the data fields 1002c, 1002d in the same order as they are in the data unit 1000.

To compress varying size data fields, such as data fields 1002a, 1002b, 1002c, 1002d, the compression engine (e.g., compression engine 606 in FIG. 6) may be configured to handle multiple bit formats for compression.

FIGS. 11A and 11B are block diagrams illustrating example mappings of a 16-bit Bfloat16 floating point type data unit to data fields according to some embodiments. The example illustrated in FIG. 11A represents a mapping of a 16 bit floating point number data unit 1100 in the Bfloat16 floating point format to two differently sized data fields 1102a and 1102b. Similar to other floating point data types, for the Bfloat16 floating point type data, exponent and sign bits may vary slowly compared to fraction bits (also referred to as significand or mantissa). To take advantage of the higher locality in the exponent and sign bits, bit 8 through bit 15 of the exponent and the sign bit 16 may be mapped to data field 1102a, and the lower locality faction bits, bit 1 through bit 7, may be mapped separately to data field 1102b.

The example illustrated in FIG. 11B represents a mapping of the 16-bit Bfloat16 floating point number data unit 1100 to two differently sized data fields 1102c and 1102d. The locality of the high locality bits may be improved further, and as a result, the compression ratio of the high locality bits, by mapping the sign bit with the lower locality bits rather than with the higher locality bits. The higher locality bits in the exponent, bit 8 through bit 15 may be mapped to data field 1102c, and the lower locality faction bits, bit 1 through bit 7, and the sign bit, bit 16, may be mapped separately to data field 1102d. This example further illustrates that the bits of the data unit 1100 do not need to be mapped to the data fields 1102c, 1102d in the same order as they are in the data unit 1100.

To compress varying size data fields, such as data fields 1102a, 1102b, 1102c, 1102d, the compression engine (e.g., compression engine 606 in FIG. 6) may be configured to handle multiple bit formats for compression.

Figure 12A:
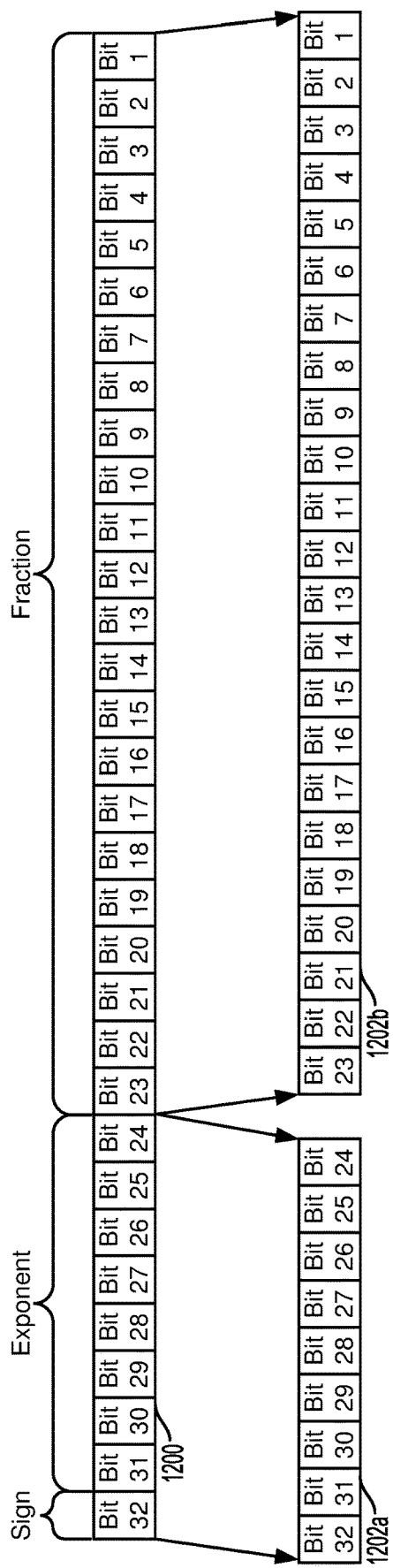
FIGS. 12A and 12B are block diagrams illustrating example mappings of 32-bit floating point type data units to data fields according to some embodiments.
Figure 12B:
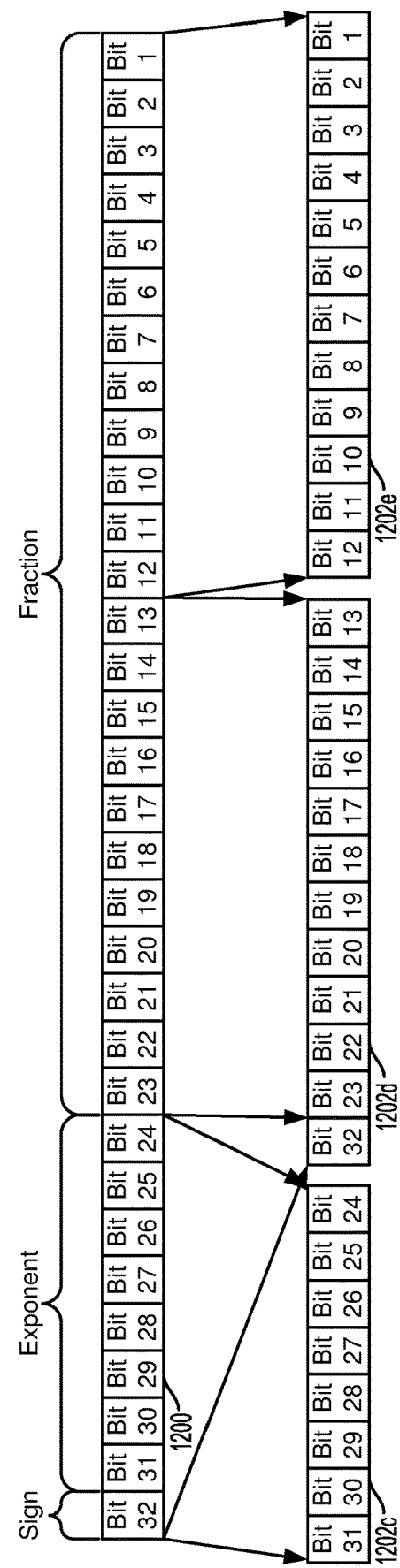

FIGS. 12A and 12B are block diagrams illustrating example mappings of a 32-bit floating point type data unit to data fields according to some embodiments. The example illustrated in FIG. 12A represents a mapping of a 32-bit floating point number data unit 1200 to two differently sized data fields 1202a and 1202b. Similar to other floating point data types, for 32-bit floating point type data, exponent and sign bits may vary very slowly compared to fraction bits (also referred to as significand or mantissa). To take advantage of the higher locality in the exponent and sign bits, bit 24 through bit 31 of the exponent and the sign bit 32 may be mapped to data field 1202a, and the lower locality faction bits, bit 1 through bit 23, may be mapped separately to data field 1202b.

The example illustrated in FIG. 12B represents a mapping of the 32-bit floating point number data unit 1200 to three data fields 1202c, 1202d, and 1202e, two of which are the same size and one of which is smaller. The locality of the high locality bits may be improved further, and as a result, the compression ratio of the high locality bits, by mapping the sign bit with the lower locality bits rather than with the higher locality bits. The higher locality bits in the exponent, bit 24 through bit 31 may be mapped to data field 1202c, and the lower locality faction bits, bit 1 through bit 23, and the sign bit, bit 16, may be mapped separately to two data fields 1202d and 1202e. Mapping the sign bit with the faction bits may allow for an even split of the lower locality bits into the two data fields 1202d and 1202e. Splitting the large number of bits into two smaller data fields 1202d and 1202e may also prove to have some locality advantages as the most significant bits may vary less than the least significant bits. Also, a greater compression ratio may be able to be accomplished in compressing smaller groups of data. This example further illustrates that the bits of the data unit 1200 do not need to be mapped to the data fields 1202c, 1202d, 1202e in the same order as they are in the data unit 1200.

To compress varying size data fields, such as data fields 1202a, 1202b, 1202c, 1202d, 1202e the compression engine (e.g., compression engine 606 in FIG. 6) may be configured to handle multiple bit formats for compression.

Figure 13:
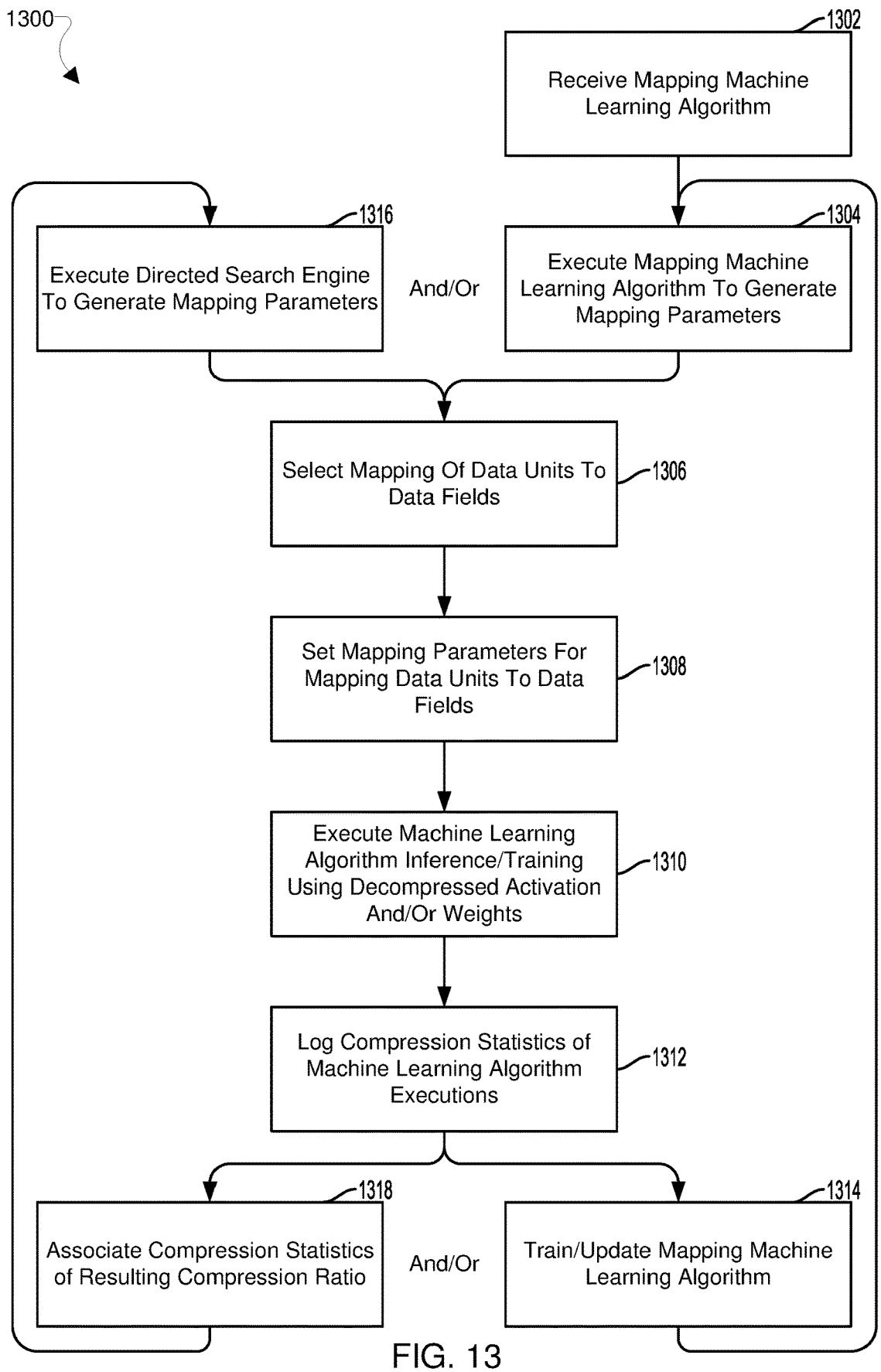
FIG. 13 is a process flow diagram illustrating selection of a mapping of data units to data fields according to some embodiments.

FIG. 13 illustrates a method 1300 for selecting a mapping of data units to data fields according to some embodiments. With reference to FIGS. 1-13, the method 1300 may be implemented in a computing device (e.g., 100), in software executing in a processor (e.g., 104), in general purpose hardware, in dedicated hardware, or in a combination of a software-configured processor and dedicated hardware, such as a processor executing software within a system for compression of high dynamic ratio fields for machine learning that includes other individual components (e.g., memory 106, 114, 616), and various memory/cache controllers. In order to encompass the alternative configurations enabled in various embodiments, the hardware implementing the method 1300 is referred to herein as a "processing device." In some embodiments, blocks 1304, 1316, 1306, 1308 of the method 1300 may further describe selecting a mapping for the data units to an S number of data fields in optional block 504 of the method 500a in FIG. 5A. In some embodiments, blocks 1310, 1312, 1314, and 1318 may be implemented following an implementation of the method 500a and/or method 500b.

In block 1302, the processing device may receive a mapping machine learning algorithm. The mapping machine learning algorithm may be trained offline to select a specific mapping. The mapping machine learning algorithm may be any of a variety of known machine learning algorithms, including, for example, a boosted tree machine learning algorithm, which may implement gradient boosting to produce a model from an ensemble of decision tree classification models that may be combined additively to reduce classification error.

In block 1304, the processing device may execute a mapping machine learning algorithm to generate mapping parameters. Prior to any online training of the mapping machine learning algorithm, the execution of a mapping machine learning algorithm may be execution of the mapping machine learning algorithm as received in block 1302.

Once online training of the mapping machine learning algorithm begins, the mapping machine learning algorithm may be updated, as described further herein, and successive executions of the mapping machine learning algorithm in block 1304 may use updated versions of the mapping machine learning algorithm. The mapping parameters may include a number (e.g., S) of data fields to which to map bits of each data unit of a compression block. The mapping parameters may include a mapping of the bits or a range of bits of the data units to the data fields. By mapping all bits in all data units to the number (e.g., S) of data fields the mapping parameters generate that number of pluralities of data fields.

In an alternative to and/or in addition to blocks 1302 and 1304, in block 1316, the processing device may execute a directed search engine to generate mapping parameters. The directed search engine may have a goal of finding mapping parameters that may result in a highest compression ratio for the data units. Successive executions of the directed search engine, as described further herein, may generate mapping parameters, for example, from a set of available mapping parameters, that achieve or fail to achieve the highest compression ratio for the data units. The available mapping parameters may be defined by the size of the data units and the possible number of data fields to which the data units may be mapped. Each successive execution may generate different mapping parameters than previously generated in attempting to achieve the highest compression ratio for the data units. The directed search engine may be any of a variety of known directed search engine, including, for example, a genetic search engine. The mapping parameters may include a number of data fields to which to map each data unit of a compression block. The mapping parameters may include a mapping of the bits or a range of bits of the data units to the data fields.

In some embodiments, the processing device may execute a mapping machine learning algorithm to generate mapping parameters in block 1304 and/or a directed search engine to generate mapping parameters in block 1316. In other words, the processing device may execute a mapping machine learning algorithm to generate mapping parameters in block 1304 or a directed search engine to generate mapping parameters in block 1316 during separate instances of selection of a mapping, such that only one of the machine learning algorithm or the directed search engine may be used to generate mapping parameters. In some embodiments, the processing device may execute a mapping machine learning algorithm to generate mapping parameters in block 1304 and a directed search engine to generate mapping parameters in block 1316 serially during a same instance of selection of a mapping.

In some embodiments, the processing device may execute a mapping machine learning algorithm to generate mapping parameters in block 1304 and a directed search engine to generate mapping parameters in block 1316 in parallel during a shared instance of selection of a mapping. In some embodiments, whether the processing device executes a mapping machine learning algorithm to generate mapping parameters in block 1304 or a directed search engine to generate mapping parameters in block 1316 may depend on various factors. In some embodiments, the factors may include periodic scheduling, age of data used to execute the mapping machine learning algorithm or directed search engine, elapsed number of selections of a mapping since last executing the mapping machine learning algorithm or directed search engine; an error rate for the mapping machine learning algorithm or directed search engine, etc.

In block 1306, the processing device may select a mapping of data units to data fields. In response to being presented with mapping parameters from the mapping machine learning algorithm and directed search engine, the processing device may select which of the mapping parameters to use to dictate the mapping of data units to data fields. The selection may be made based on statistical analysis and estimation of compression ratio as discussed herein with reference to blocks 702 and 704 of the method 700 in FIG. 7. In some embodiments, the selection may be made by pseudorandom choice. In some embodiments, the selection may be made by periodic scheduling, age of data used to execute the mapping machine learning algorithm or directed search engine, elapsed number of selections of a mapping since last executing the mapping machine learning algorithm or directed search engine; an error rate for the mapping machine learning algorithm or directed search engine, etc.

In block 1308, the processing device may set mapping parameters for the mapping of data units to data fields based on the mapping selected in block 1306. The mapping may be used to separate the data units of a compression block into data fields in preparation for compressing the data fields.

In block 1310, the processing device may execute a machine learning algorithm inference/training using decompressed activation and/or weights data. The processing device may apply the mapping of data units to data fields to the decompressed activation and/or weights to reconstruct the compression block. The processing device may use the compression block data as activation and/or weights data to execute the machine learning algorithm inference/training. In some embodiments, the machine learning algorithm inference/training may be executed as many as K times, the same number of times as a size of the compression block.

In block 1312, the processing device may log compression statistics of machine learning algorithm executions. Such compression statistics may include compression ratios for the data fields, the data units, and/or the compression block. The compression statistics may include error values of the machine learning algorithm inference/training. The compression statistics may include speed performance values and/or power consumption values of the machine learning algorithm inference/training.

In block 1314, the processing device may train/update the mapping machine learning algorithm using the compression statistics. The processing device may use the compression statistics as activation and/or weight data to train the mapping machine learning algorithm. The processing device may execute the mapping machine learning algorithm to generate mapping parameters in block 1304.

In block 1318, the processing device may associate the compression statistics with a resulting compression ratio. The processing device may store the association between the compression statistics and the resulting compression ratio to inform future searches for mapping parameters for the mapping of data units to data fields. The processing device may execute the directed search engine to generate mapping parameters in block 1316

In some embodiments, training/updating the mapping machine learning algorithm using the compression statistics in block 1314 and associating the compression statistics with a resulting compression ratio in block 1318 may occur in various combinations. Training/updating the mapping machine learning algorithm using the compression statistics in block 1314 may be executed in response to executing a mapping machine learning algorithm to generate mapping parameters in block 1304 and/or the directed search engine to generate mapping parameters in block 1316. Training/ updating the mapping machine learning algorithm using the compression statistics in block 1314 may be executed in response to selection of the mapping parameters provided by the mapping machine learning algorithm and/or the mapping parameters provided by the directed search engine in block 1306. Associating the compression statistics with a resulting compression ratio in block 1318 may be executed in response to executing a mapping machine learning algorithm to generate mapping parameters in block 1304 and/or the directed search engine to generate mapping parameters in block 1316. Associating the compression statistics with a resulting compression ratio in block 1318 may be executed in response to selection of the mapping parameters provided by the mapping machine learning algorithm and/or the mapping parameters provided by the directed search engine in block 1306.

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method of decompressing data, comprising:
   receiving, by a processor, first and second compressed sets of data fields;
   decompressing, by the processor, the first and second compressed sets of data fields to generate first and second decompressed sets of data fields;
   receiving, by the processor, a mapping for mapping the first and second decompressed sets of data fields to a set of data units; and
   aggregating, by the processor, the first and second decompressed sets of data fields using the mapping to generate a compression block comprising the set of data units.

2. The method of claim 1, further comprising receiving, by the processor, first and second metadata associated respectively with the first and second compressed sets of data fields.

3. The method of claim 2, further comprising using, by the processor, the associated first and second metadata in the decompressing of the first and second compressed sets of data fields.

4. The method of claim 2, further comprising using, by the processor, the associated first and second metadata to identify the mapping.

5. The method of claim 1, wherein the mapping is a predetermined mapping.

6. The method of claim 1, wherein each of the first and second compressed sets of data fields comprises data and corresponding information bits that characterize the corresponding data.

7. The method of claim 1, wherein receiving, by the processor, the first and second compressed sets of data fields comprises retrieving the first and second compressed sets of data fields from a memory.

8. The method of claim 1, wherein the mapping maps the first and second decompressed sets of data fields to the bits of the set of data units based on any of the sizes of the data units, types of the data units, locality of portions of the data units, or estimated compression ratios of portions of the data units.

9. The method of claim 1, wherein:
the decompressing of the first compressed set of data fields uses a first decompression method; and
the decompressing of the second compressed set of data fields uses a second decompression method different from the first decompression method.

10. A computing device comprising a processor and a memory, wherein the processor is adapted to:
receive first and second compressed sets of data fields;
decompress the first and second compressed sets of data fields to generate first and second decompressed sets of data fields;
receive a mapping for mapping the first and second decompressed sets of data fields to a set of data units;
aggregate the first and second decompressed sets of data fields using the mapping to generate a compression block comprising the set of data units.

11. The device of claim 10, wherein the process is further adapted to receive first and second metadata associated respectively with the first and second compressed sets of data fields.

12. The device of claim 11, wherein the processor is further adapted to use the associated first and second metadata to decompress the first and second compressed sets of data fields.

13. The device of claim 11, wherein the processor is further adapted to use the associated first and second metadata to identify the mapping.

14. The device of claim 10, wherein the mapping is a predetermined mapping.

15. The device of claim 10, wherein each of the first and second compressed sets of data fields comprises data and corresponding information bits that characterize the corresponding data.

16. The device of claim 10, wherein the processor is adapted to receive the first and second compressed sets of data fields by retrieving the first and second compressed sets of data fields from the memory.

17. The device of claim 10, wherein the mapping maps the first and second decompressed sets of data fields to the bits of the set of data units based on any of the sizes of the data units, types of the data units, locality of portions of the data units, or estimated compression ratios of portions of the data units.

18. The device of claim 10, wherein the processor is adapted to:
decompress the first compressed set of data fields using a first decompression method; and
decompress the second compressed set of data fields using a second decompression method different from the first decompression method.

* * * * *